United States Patent
Conti et al.

(10) Patent No.: US 12,057,803 B2
(45) Date of Patent: Aug. 6, 2024

(54) MECHANICALLY STACKED SOLAR TRANSMISSIVE CELLS OR MODULES

(71) Applicant: Conti SPE, LLC, Summit, NJ (US)

(72) Inventors: Kurt G. Conti, New Providence, NJ (US); Cullin J. Wible, Austin, TX (US)

(73) Assignee: CONTI INNOVATION CENTER, LLC, Orlando, FL (US)

( * ) Notice: Subject to any disclaimer, the term of this patent is extended or adjusted under 35 U.S.C. 154(b) by 0 days.

(21) Appl. No.: 17/841,218

(22) Filed: Jun. 15, 2022

(65) Prior Publication Data

US 2022/0406950 A1   Dec. 22, 2022
US 2023/0378904 A9   Nov. 23, 2023

Related U.S. Application Data

(60) Provisional application No. 63/211,262, filed on Jun. 16, 2021.

(51) Int. Cl.
| | | |
|---|---|---|
| H01L 31/043 | (2014.01) | |
| F16M 11/18 | (2006.01) | |
| H01L 31/054 | (2014.01) | |
| H02S 30/10 | (2014.01) | |
| H02S 50/10 | (2014.01) | |

(52) U.S. Cl.
CPC ............ H02S 30/10 (2014.12); F16M 11/18 (2013.01); H01L 31/043 (2014.12); H01L 31/0547 (2014.12); H02S 50/10 (2014.12)

(58) Field of Classification Search
CPC ... H01L 31/043; H01L 31/046; H01L 31/048; H01L 31/0547; H01L 31/0687; H01L 31/0725; H02S 30/10
See application file for complete search history.

(56) References Cited

U.S. PATENT DOCUMENTS

| | | |
|---|---|---|
| 4,461,922 A | 7/1984 | Gay et al. |
| 4,909,857 A | 3/1990 | Ondris et al. |
| 5,261,969 A | 11/1993 | Stanbery |
| 5,393,675 A | 2/1995 | Compaan |
| 5,922,142 A | 7/1999 | Wu et al. |
| 6,852,614 B1 | 2/2005 | Compaan |
| 7,098,058 B1 | 8/2006 | Karpov |

(Continued)

FOREIGN PATENT DOCUMENTS

| | | |
|---|---|---|
| CN | 109037390 | 12/2018 |
| CN | 107341566 B | 7/2020 |

(Continued)

OTHER PUBLICATIONS

Machine translation of DE-102011087672-A1, Hoon P et al. (Year: 2012).*

(Continued)

*Primary Examiner* — Mayla Gonzalez Ramos
(74) *Attorney, Agent, or Firm* — Volpe Koenig

(57) ABSTRACT

A device is provided. The device includes mechanically stacked layers. The mechanically stacked layers include a bottom layer and upper layers. Each upper layer includes a transmissive solar cell that converts light energy into electricity. Each upper layer transmits unconverted portions of the light energy towards the bottom layer. The bottom layer includes a solar cell that converts the unconverted portions of the light energy into electricity.

8 Claims, 9 Drawing Sheets

(56) References Cited

U.S. PATENT DOCUMENTS

| | | |
|---|---|---|
| 7,141,863 B1 | 11/2006 | Compaan |
| 8,124,870 B2 | 2/2012 | Woods et al. |
| 8,143,515 B2 | 3/2012 | Gossman et al. |
| 8,224,189 B1 | 7/2012 | Frolov |
| 8,293,009 B2 | 10/2012 | Sachs |
| 8,298,856 B2 | 10/2012 | Garnett |
| 8,448,898 B1 | 5/2013 | Frolov et al. |
| 8,455,808 B1 | 6/2013 | Frolov |
| 8,461,504 B1 | 6/2013 | Frolov et al. |
| 8,519,435 B2 | 8/2013 | Vasko |
| 8,580,603 B2 | 11/2013 | Basol |
| 8,633,052 B2 | 1/2014 | Polito |
| 8,664,524 B2 | 3/2014 | Garnett |
| 8,696,810 B2 | 4/2014 | Hantsoo |
| 8,746,620 B1 | 6/2014 | Moussouris et al. |
| 8,829,342 B2 | 9/2014 | Compaan |
| 8,897,770 B1 | 11/2014 | Frolov et al. |
| 9,054,245 B2 | 6/2015 | Feldman-Peabody et al. |
| 9,090,403 B2 | 7/2015 | Ng |
| 9,123,838 B2 | 9/2015 | Fogel et al. |
| 9,136,408 B2 | 9/2015 | Irwin |
| 9,159,851 B2 | 10/2015 | Liu |
| 9,269,849 B2 | 2/2016 | Yu et al. |
| 9,305,715 B2 | 4/2016 | Irwin |
| 9,306,107 B2 | 4/2016 | Hong et al. |
| 9,331,292 B2 | 5/2016 | Irwin |
| 9,391,700 B1 | 7/2016 | Bruce et al. |
| 9,416,279 B2 | 8/2016 | Irwin |
| 9,425,346 B2 | 8/2016 | Polito |
| 9,425,396 B2 | 8/2016 | Irwin |
| 9,570,795 B1 | 2/2017 | Bruce et al. |
| 9,590,128 B2 | 3/2017 | Cauffiel |
| 9,617,431 B2 | 4/2017 | Irwin |
| 9,698,285 B2 | 7/2017 | Damjanovic et al. |
| 9,750,795 B2 | 9/2017 | Weiner |
| 9,758,257 B1 | 9/2017 | Frolov et al. |
| 9,799,784 B2 | 10/2017 | Allenic et al. |
| 9,841,616 B1 | 12/2017 | Bruce et al. |
| 9,853,177 B2 | 12/2017 | Yu et al. |
| 9,871,154 B2 | 1/2018 | Duggal et al. |
| 9,880,458 B1 | 1/2018 | Irwin |
| 9,884,966 B2 | 2/2018 | Irwin |
| 9,899,560 B2 | 2/2018 | Velappan et al. |
| 9,923,115 B2 | 3/2018 | Cauffiel |
| 9,941,480 B2 | 4/2018 | Irwin |
| 9,969,893 B2 | 5/2018 | Kim et al. |
| 9,991,457 B2 | 6/2018 | Irwin |
| 10,043,922 B2 | 8/2018 | Heben |
| 10,062,800 B2 | 8/2018 | Blaydes et al. |
| 10,072,351 B2 | 9/2018 | Sachs |
| 10,141,473 B1 | 11/2018 | Blaydes et al. |
| 10,189,998 B2 | 1/2019 | Irwin |
| 10,193,087 B2 | 1/2019 | Irwin |
| 10,316,196 B2 | 6/2019 | Irwin |
| 10,367,110 B2 | 7/2019 | Jin et al. |
| 10,439,095 B2 | 10/2019 | Jonczyk |
| 10,505,240 B1 | 12/2019 | Bruce et al. |
| 10,529,883 B2 | 1/2020 | Damjanovic et al. |
| 10,549,476 B2 | 2/2020 | Sachs |
| 10,608,190 B2 | 3/2020 | Irwin |
| 10,633,765 B2 | 4/2020 | Jonczyk |
| 10,642,147 B2 | 5/2020 | Irwin |
| 10,651,323 B2 | 5/2020 | Gessert |
| 10,741,779 B2 | 8/2020 | Irwin |
| 10,784,397 B2 | 9/2020 | Blaydes et al. |
| 10,797,641 B2 | 10/2020 | Irwin |
| 10,896,991 B2 | 1/2021 | Jin et al. |
| 10,907,050 B2 | 2/2021 | Irwin |
| 10,916,672 B2 | 2/2021 | Compaan |
| 10,916,712 B2 | 2/2021 | Irwin |
| 10,959,180 B2 | 3/2021 | Zhang |
| 11,024,814 B2 | 6/2021 | Irwin |
| 11,042,047 B1 | 6/2021 | Bruce et al. |
| 11,171,290 B2 | 11/2021 | Irwin |
| 11,186,495 B2 | 11/2021 | Irwin |
| 11,264,572 B2 | 3/2022 | Irwin |
| 11,300,870 B2 | 4/2022 | Irwin |
| 11,387,779 B2 | 7/2022 | Irwin |
| 11,450,778 B2 | 9/2022 | Ring et al. |
| 11,508,924 B2 | 11/2022 | Irwin |
| 11,562,920 B2 | 1/2023 | Steeman |
| 11,784,278 B2 | 10/2023 | Andreini et al. |
| 11,876,140 B2 | 1/2024 | Blaydes et al. |
| 2004/0118451 A1* | 6/2004 | Walukiewicz ...... H01L 31/0735 438/93 |
| 2005/0012113 A1 | 1/2005 | Sheu et al. |
| 2006/0180197 A1 | 8/2006 | Gui et al. |
| 2008/0216885 A1 | 9/2008 | Frolov et al. |
| 2009/0078318 A1 | 3/2009 | Meyers et al. |
| 2009/0146501 A1 | 6/2009 | Cyrus |
| 2009/0151775 A1 | 6/2009 | Pietrzak |
| 2009/0211622 A1 | 8/2009 | Frolov et al. |
| 2009/0215215 A1 | 8/2009 | Frolov et al. |
| 2009/0218651 A1 | 9/2009 | Frolov et al. |
| 2009/0221111 A1 | 9/2009 | Frolov et al. |
| 2009/0250096 A1 | 10/2009 | Pan |
| 2009/0250722 A1 | 10/2009 | Bruce et al. |
| 2009/0255567 A1 | 10/2009 | Frolov et al. |
| 2009/0308437 A1 | 12/2009 | Woods et al. |
| 2010/0015753 A1 | 1/2010 | Garnett |
| 2010/0024876 A1 | 2/2010 | McClary et al. |
| 2010/0059101 A1 | 3/2010 | Shinohara |
| 2010/0084924 A1 | 4/2010 | Frolov et al. |
| 2010/0089441 A1 | 4/2010 | Frolov et al. |
| 2010/0098854 A1 | 4/2010 | Bruce et al. |
| 2010/0129957 A1 | 5/2010 | Frolov et al. |
| 2010/0154327 A1 | 6/2010 | Reyal et al. |
| 2010/0170556 A1 | 7/2010 | Frolov et al. |
| 2010/0212714 A1 | 8/2010 | Rothschild et al. |
| 2010/0229923 A1 | 9/2010 | Frolov et al. |
| 2010/0233843 A1 | 9/2010 | Frolov et al. |
| 2010/0288335 A1 | 11/2010 | Frolov et al. |
| 2010/0294346 A1 | 11/2010 | Frolov et al. |
| 2010/0294354 A1 | 11/2010 | Frolov et al. |
| 2010/0314238 A1 | 12/2010 | Frolov et al. |
| 2011/0024724 A1 | 2/2011 | Frolov et al. |
| 2011/0067757 A1 | 3/2011 | Frantz et al. |
| 2011/0143489 A1 | 6/2011 | Korevaar |
| 2012/0019074 A1 | 1/2012 | Frolov et al. |
| 2012/0027924 A1 | 2/2012 | Castellano |
| 2012/0060923 A1 | 3/2012 | Zhao et al. |
| 2012/0097222 A1 | 4/2012 | Gessert et al. |
| 2012/0145240 A1 | 6/2012 | Carcia |
| 2012/0153341 A1 | 6/2012 | Vasko |
| 2012/0233940 A1 | 9/2012 | Perkins et al. |
| 2013/0068287 A1 | 3/2013 | Compaan |
| 2013/0074921 A1 | 3/2013 | Tang et al. |
| 2013/0174895 A1 | 7/2013 | Compaan |
| 2013/0206217 A1 | 8/2013 | Liu |
| 2013/0230944 A1 | 9/2013 | Feldman-Peabody et al. |
| 2014/0000690 A1 | 1/2014 | Plotnikov |
| 2014/0000692 A1 | 1/2014 | Fogel et al. |
| 2014/0113156 A1 | 4/2014 | Jonczyk |
| 2014/0196761 A1 | 7/2014 | Tilley et al. |
| 2014/0216534 A1 | 8/2014 | Hong et al. |
| 2014/0216542 A1 | 8/2014 | Shao et al. |
| 2014/0216550 A1 | 8/2014 | Damjanovic et al. |
| 2014/0261692 A1 | 9/2014 | Irwin |
| 2014/0264988 A1 | 9/2014 | Bekele et al. |
| 2014/0275552 A1 | 9/2014 | Irwin |
| 2014/0275602 A1 | 9/2014 | Irwin |
| 2014/0284750 A1 | 9/2014 | Yu et al. |
| 2014/0302178 A1 | 10/2014 | Polansky |
| 2014/0360576 A1 | 12/2014 | Plotnikov |
| 2015/0097071 A1 | 4/2015 | Frolov et al. |
| 2015/0097079 A1 | 4/2015 | Frolov et al. |
| 2015/0122947 A1 | 5/2015 | Bruce et al. |
| 2015/0144186 A1 | 5/2015 | Gessert |
| 2015/0171260 A1 | 6/2015 | Liu et al. |
| 2015/0207011 A1 | 7/2015 | Garnett et al. |
| 2015/0221790 A1 | 8/2015 | Heben |
| 2015/0249172 A1 | 9/2015 | Irwin |
| 2015/0280644 A1 | 10/2015 | Gostein et al. |
| 2015/0287872 A1 | 10/2015 | Cauffiel |

(56) References Cited

U.S. PATENT DOCUMENTS

| | | |
|---|---|---|
| 2016/0060468 A1 | 3/2016 | Kim et al. |
| 2016/0118934 A1 | 4/2016 | Johnson et al. |
| 2016/0126395 A1 | 5/2016 | Damjanovic et al. |
| 2016/0126397 A1 | 5/2016 | Yu et al. |
| 2016/0240796 A1 | 8/2016 | Irwin |
| 2016/0344330 A1 | 11/2016 | Gillis |
| 2016/0363938 A1 | 12/2016 | Frolov et al. |
| 2017/0040933 A1 | 2/2017 | Vogel |
| 2017/0094142 A1 | 3/2017 | Irwin |
| 2017/0125625 A1 | 5/2017 | Cauffiel |
| 2018/0001975 A1 | 1/2018 | Jaramillo |
| 2018/0054156 A1 | 2/2018 | Lokey |
| 2018/0076764 A1 | 3/2018 | Irwin |
| 2018/0083151 A1 | 3/2018 | Shibasaki et al. |
| 2018/0254741 A1 | 9/2018 | Jones |
| 2018/0301288 A1 | 10/2018 | Irwin |
| 2018/0302021 A1 | 10/2018 | Hall et al. |
| 2018/0317289 A1 | 11/2018 | Frolov et al. |
| 2019/0115974 A1 | 4/2019 | Frolov et al. |
| 2019/0181793 A1 | 6/2019 | Azad |
| 2019/0296174 A1 | 9/2019 | Gloeckler et al. |
| 2019/0305166 A1 | 10/2019 | Compaan |
| 2019/0341506 A1 | 11/2019 | Sampath et al. |
| 2019/0393828 A1 | 12/2019 | Huuhtanen et al. |
| 2020/0052643 A1 | 2/2020 | Ballentine et al. |
| 2020/0106518 A1 | 4/2020 | Frolov et al. |
| 2020/0157125 A1 | 5/2020 | Irwin |
| 2020/0206771 A1 | 7/2020 | DeVos |
| 2020/0332408 A1 | 10/2020 | Irwin |
| 2021/0006201 A1 | 1/2021 | Hinson |
| 2021/0143350 A1 | 5/2021 | Irwin |
| 2021/0211095 A1 | 7/2021 | Xu et al. |
| 2022/0069151 A1 | 3/2022 | Powell et al. |
| 2022/0085226 A1 | 3/2022 | Okumura et al. |
| 2023/0317870 A1 | 10/2023 | Peng et al. |

FOREIGN PATENT DOCUMENTS

| | | |
|---|---|---|
| DE | 102011087672 A1 | 8/2012 |
| DE | 102011089916 A1 | 6/2013 |
| WO | 2009/105683 | 8/2009 |
| WO | 2011035234 A1 | 3/2011 |
| WO | 2011142804 A1 | 11/2011 |
| WO | 2014028526 A2 | 2/2014 |
| WO | 2015126918 A1 | 8/2015 |
| WO | 2018/071509 | 4/2018 |
| WO | 2018/085829 | 5/2018 |
| WO | 2020/065060 A1 | 4/2020 |
| WO | 2020246074 A1 | 12/2020 |

OTHER PUBLICATIONS

Machine translation of DE102011087672A1, Hoon et al. (Year: 2012).*
International Search Report and Written Opinion for Application No. PCT/US2022/033603 dated Sep. 28, 2022.
International Search Report and Written Opinion for Application No. PCT/US2022/033612 dated Sep. 23, 2022.
International Search Report and Written Opinion for Application No. PCT/US2022/033659 dated Oct. 5, 2022.
Spanias Andreas S: "Solar energy management as an Internet of Things (IoT) application", 2017 8th International Conference on Information, Intelligence, Systems & Application (IISA), IEEE, Aug. 27, 2017 (Aug. 27, 2017), pp. 1-4, XP033331189, DOI: 10.1109/IISA.2017.8316460 [retrieved on Mar. 14, 2018] p. 1, right-hand column, p. 1, right-hand column, paragraph 4—p. 3, left-hand colulmn, paragraph 1; figures 2,4.
U.S. Appl. No. 10/505,240, filed Dec. 10, 2019, Bruce et al.
U.S. Appl. No. 10/529,883, filed Jan. 7, 2020, Damjanovic et al.
U.S. Appl. No. 11/042,047, filed Jun. 22, 2021, Bruce et al.
Vieira et al. "A Comprehensive Review on Bypass Diode Application on Photovoltaic Modules" Energies 13, No. 10: 2472 (2020).
Comprehensive Guide on Organic and Inorganic Solar Cells, Fundamental Concepts to Fabrication Methods, 1st Edition (Nov. 16, 2021).
Subedi et al., "Enabling bifacial thin film devices by developing a back surface field using CuxAlOy". United States (2021).
Hall et al., Back contacts materials used in thin film CdTe solar cells—A review. Energy Sci Eng. 2021; 9: 606-632 (2021).
Liu et al., "High-Efficiency Isolated Photovoltaic Microinverter Using Wide-Band Gap Switches for Standalone and Grid-Tied Applications" Energies 11, No. 3: 569 (2018).
Materials for Solar Energy Conversion: Materials, Methods and Applications, R. Rajasekar (Editor), C. Moganapriya (Editor), A. Mohankumar (Editor), ISBN: 978-1-119-75060-4 (Nov. 2021).
Subedi et al., "Nanocomposite $(CuS)_x(ZnS)_{1-x}$ Thin Film Back Contact for CdTe Solar Cell: Toward a Bifacial Device," (2018).
Bauwens et al., "NMOS-Based Integrated Modular Bypass for Use in Solar Systems (NIMBUS): Intelligent Bypass for Reducing Partial Shading Power Loss in Solar Panel Applications" Energies 9, No. 6: 450 (2016).
Prism Solar Data Sheet, BN72 Bifacial Modules, 72—Cell Bifacial Series BN72—370, Available at: https://static1.squarespace.com/static/57a12f5729687f4a21ab938d/t/5e509ebbdbfcb2688ef27902/1582341820082/Prism+Solar+~+BN72+~+Gen2+~+360-370W+~+v1.2.pdf (2020).
International Preliminary Report on Patentability received in related international application No. PCT/US2022/033659, mailed Jul. 25, 2023, 35 pages.
Non-Final Office Action for U.S. Appl. No. 17/841,239 dated Aug. 16, 2023.
International Preliminary Report on Patentability Chapter II dated Jan. 23, 2024 for PCT International Application No. PCT/US2022/041026.
International Search Report and Written Opinion mailed on Feb. 16, 2023 for PCT International Application No. PCT/US2022/041026.
Sharma et al., "CdZnTe thin films as proficient absorber layer candidates in solar cell devices: a review" (2023).
Samoilenko, "Development of Ii-Vi Ternary Alloys For CDTE-Based Solar Cells" (2020).
Sharma et al., "Review on bandgap engineering in metal-chalcogenide absorber layer via grading: A trend in thin-film solar cells," Solar Energy, vol. 246, pp. 152-180 (2022).
Hossain et al., "Tuning the bandgap of $Cd_{1-x}Zn_xS$ (x=0~1) buffer layer and CIGS absorber layer for obtaining high efficiency," Superlattices and Microstructures, vol. 161, (2022).
Bastola et al., "Cadmium Selenide (CdSe) as an Active Absorber Layer for Solar Cells with Voc Approaching 750 mV," 2023 IEEE 50th Photovoltaic Specialists Conference (PVSC), San Juan, PR, USA, 2023, pp. 1-6 (2023).
McCandless et al., "$Cd_{1-x}Zn_xTe$ Solar Cells with 1.6 eV Band Gap" (2005).
Liu et al., Solution processed CdTe/CdSe nanocrystal solar cells with more than 5.5% efficiency by using an inverted device structure, (Mar. 10, 2015).
Streetman et al., "Solid State Electronic Devices," Solid State Electronic Devices, 6th Edition (Aug. 5, 2005).
International Preliminary Report on Patentability received in related international application No. PCT/US2022/033612, mailed Aug. 18, 2023, 7 pages.
International Preliminary Report on Patentability received in related international application No. PCT/US2022/033603, mailed Oct. 11, 2023, 8 pages.
Xue et al., "Recent progress on solution-processed CdTe nanocrystals solar cells," Applied Sciences 6, No. 7: 197 (2016).
Liu et al., "Solution processed CdTe/CdSe nanocrystal solar cells with more than 5.5% efficiency by using an inverted device structure," Journal of Materials Chemistry C 3, No. 17: 4227-4234 (2015).
Ju et al., "Thickness dependence study of inorganic CdTe/CdSe solar cells fabricated from colloidal nanoparticle solutions," Journal of Applied Physics 107, No. 10 (2010).
Kapadnis et al., "Cadmium telluride/cadmium sulfide thin films solar cells: a review," ES Energy & Environment 10, No. 2: 3-12 (2020).

(56) References Cited

OTHER PUBLICATIONS

U.S. Department of Energy, EERE Funding Opportunity Exchange, "DE-FOA-0003058: Advancing U.S. Thin-Film Solar Photovoltaics," (2023).
NREL, "News Release: NREL Awards $2 Million in Contracts to Support Development of Cheaper, More Efficient Cadmium Telluride Solar Cells," (Jun. 22, 2023).
Streetman, Solid State Electronic Devices. Third Edition. (Prentice Hall series in solid state physical electronics), 3rd Edition, pp. 144-148 (1990).
Sze, "Physics of Semiconductor Devices," Second Edition, pp. 74-84 (1981).

* cited by examiner

MECHANICALLY STACKED SOLAR TRANSMISSIVE CELLS OR MODULES

CROSS REFERENCE TO RELATED APPLICATIONS

This application claims priority from U.S. Provisional Patent Application No. 63/211,262, entitled "MODULAR SOLAR SYSTEM," filed on Jun. 16, 2021, which is hereby incorporated by reference as if set forth in full in this application for all purposes.

FIELD OF INVENTION

The disclosure herein is related to solar power generation by a modular solar system. More particularly, the disclosure herein include mechanically stacked solar transmissive cells or modules for solar power generation.

BACKGROUND

Currently, there are no economically viable techniques for conventional photovoltaic solar cells to achieve power conversion efficiencies greater than 25%. As a result, at least 75% of the sun's energy hitting earth's surface is unused.

SUMMARY

According to one or more embodiments, a device is provided. The device includes at least two mechanically stacked layers including a bottom layer and one or more upper layers. Each of the one or more upper layers includes at least one transmissive solar cell configured to convert light energy into electricity and pass unconverted portions of the light energy towards the bottom layer. The bottom layer includes at least one solar cell configured to convert at least part of the unconverted portions of the light energy into electricity.

According to one or more embodiments, a modular apparatus is provided. The modular apparatus includes at least two mechanically stacked modules including a module layer and one or more upper modules. Each of the one or more upper modules includes a plurality of transmissive solar cells configured to convert light energy received on a first side into electricity and pass unconverted portions of the light energy to a next module of the at least two mechanically stacked modules on a second side. The bottom module includes a plurality of solar cells configured to convert at least part of the unconverted portions of the light energy into electricity.

According to one or more embodiments, a system is provided. The system includes a plurality of modular apparatuses. Each modular apparatus includes at least two mechanically stacked modules. The at least two mechanically stacked modules includes a bottom module and one or more upper modules. Each of the one or more upper modules includes a plurality of transmissive solar cells configured to convert light energy into electricity and pass unconverted portions of the light energy towards the bottom modules. The bottom modules includes a plurality of solar cells configured to convert at least part of the unconverted portions of the light energy into electricity. The system includes at least two strings. Each string corresponds and electrically connects to one of the at least two mechanically staked modules to receive the electricity therefrom. Each string is electrically distinct from other strings. The system includes a support structure securing a mechanical stacking of the at least two mechanically stacked modules to vertically align the plurality of solar cells of the bottom module with each of the plurality of transmissive solar cells of each of the one or more upper modules.

Additional features and advantages are realized through the techniques of the present disclosure. Other embodiments and aspects of the disclosure are described in detail herein. For a better understanding of the disclosure with the advantages and the features, refer to the description and to the drawings.

BRIEF DESCRIPTION OF THE DRAWINGS

A more detailed understanding may be had from the following description, given by way of example in conjunction with the accompanying drawings, wherein like reference numerals in the figures indicate like elements, and wherein.

DETAILED DESCRIPTION

Disclosed herein is a modular solar system. More particularly, the modular solar system relates to stacking multiple solar modules within a framework/apparatus. The multiple solar modules include transmissivity qualities. Transmissivity allows light energy (i.e., irradiance) to pass through something. In turn, each of the multiple solar modules can absorb different light energy and can pass other (non-absorbed) light energy. More particularly, for every solar module within the modular solar system, an amount of irradiance (from all directions, as well as angles) is converted to electricity, while unused irradiance is passed therethrough. Stacking the multiple solar modules converts, as a collective group, a total radiance to electricity in a manner that provides a greater conversion percentage than conventional photovoltaic solar cells. That is, according to one or more technical effects, advantages, and benefits, the modular solar system achieves an overall light energy power conversion efficiency that is greater than conventional photovoltaic solar cells.

Figure 1:
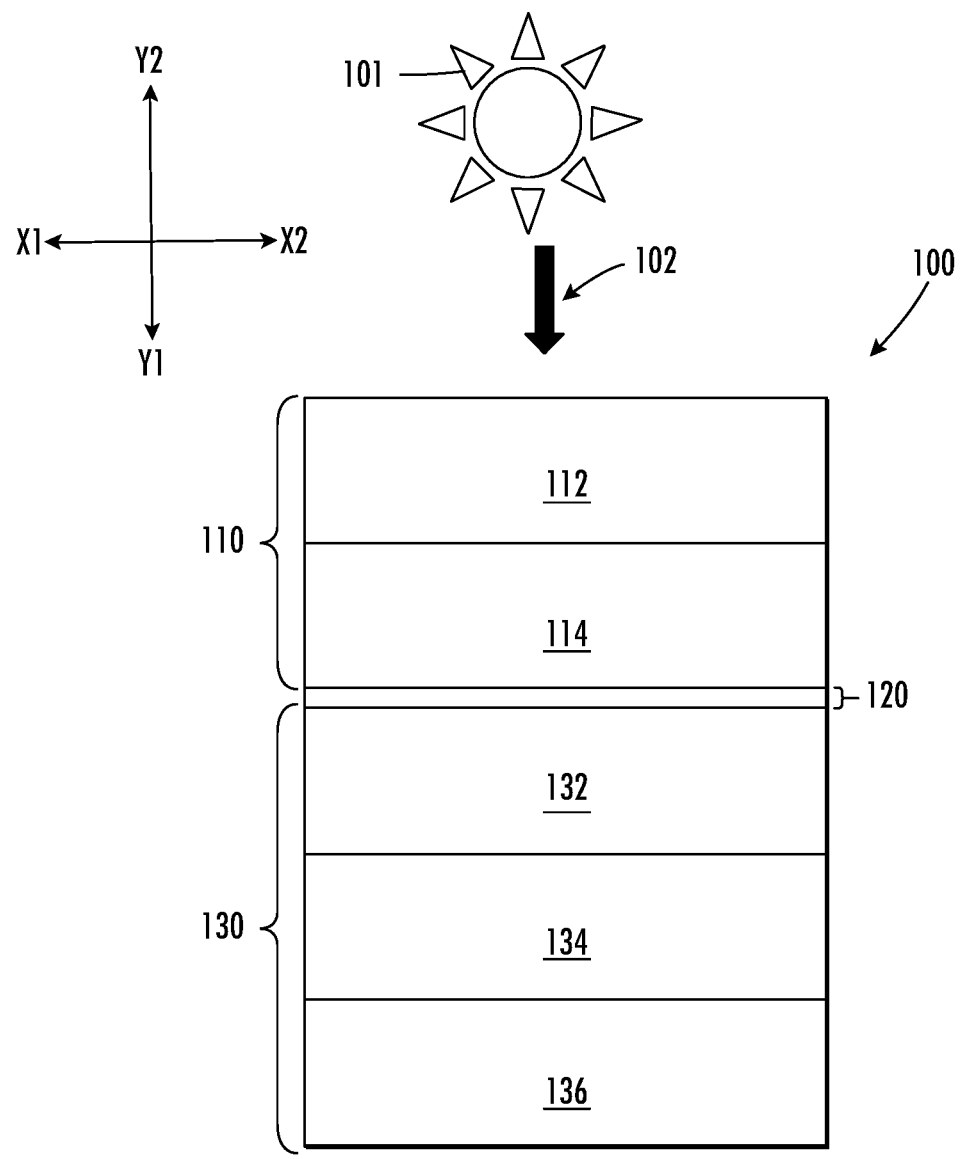
FIG. 1 depicts a device according to one or more embodiments.

FIG. 1 depicts a device 100 according to one or more embodiments. The device 100 is an example of a modular solar system. More particularly, the device 100 is an example of mechanically stacked solar transmissive cells. The device 100 of FIG. 1 is oriented according to an X1-X2 axis (e.g., generally horizontal as oriented in the Figures, with the axis having a direction between left and right as in FIG. 1) and a Y1-Y2 axis (e.g., generally vertically as oriented in the Figures, with the axis having a direction between down and up as in FIG. 1). The X1 direction is opposite the X2 direction, and the Y1 direction is opposite the Y2 direction. Other orientations can be made in accordance with the X1-X2 and Y1-Y2 axes, which may be tilted or angled. Reference to a left side or left facing surface of a component described may be referred to as an X1 side or an X1 surface of the component, while reference to a right side or right facing surface of a component described may be referred to as an X2 side or an X2 surface of the component. Similarly, reference to a lower or bottom side or a downwardly facing surface of a component described may be referred to as a Y1 side or a Y1 surface, while reference to a top or upper side or upwardly facing surface of a component described may be referred to as a Y2 side or a Y2 surface.

The device 100 receives, from at least a sun 101 (from the Y2 direction), light energy or light 102. The light 102 can be considered incident light or natural light (though other sources are contemplated). The device 100 converts one or more portions of the light 102 into electricity or electrical power, such as by aggregating dissimilar cells. The light 102 can range across the light spectrum including, but not limited to, ultraviolet (UV) light, visible light, and infrared light.

As shown, the device 100 includes an upper layer 110, which includes a transparent section 112 and a transmissive solar cell 114; an interim section 120; and a bottom layer 130+, which includes a transparent section 132, a solar cell 134, and a rear section 136. In this way, the device 100 can include at least two mechanically stacked layers (e.g., at least one of the upper layer 110 and the bottom layer 130), where each upper layer 110 can include at least one transmissive solar cell 114 (e.g., in some cases a plurality thereof) and the bottom layer 130 can include at least one solar cell 134 (e.g., in some cases a plurality thereof). According to one or more embodiments, the device 100 can include two upper layers 110 as the at least two mechanically stacked layers.

The transmissive solar cell 114 of the upper layer 110 converts portions of the light 102 into electricity and passes (in an Y1 direction) unconverted portions of the light 102 towards the bottom layer 130. The solar cell 134 of the bottom layer 130 converts at least part of the unconverted portions of the light 102 into electricity. According to one or more embodiments, each of the at least two mechanically stacked layers is electrically distinct from other layers of the at least two mechanically stacked layers. In this regard, the transmissive solar cell 114 and the upper layer 110 are electrically distinct from solar cell 134 and the bottom layer 130 (e.g., thereby providing an alternative design to tandem cells by way of a mechanically stacked configuration that is not bonded with component parts that are not electrically reliant on each other). That is, the device 100 solves problems with conventional tandem photovoltaic solar cells because the conventional tandem photovoltaic solar cells when separated will not function independently (i.e., the conventional tandem photovoltaic solar cells are effectively not separable).

The transmissive solar cell 114 can include, but is not limited to, cadmium telluride (CdTe), amorphous silicon (a-Si), perovskite, organic, and copper indium gallium selenide (CIGS). The transmissive solar cell 114 can include, but is not limited to, other additives such as zinc, selenium, tin, oxygen, copper, aluminum, carbon, or sulfur. By way of example, CdTe, a-Si, and CIGS include bandgaps greater than c-Si. In this way, the upper layer 110 includes materials with a higher bandgap than crystalline silicon (c-Si) of conventional photovoltaic solar cells, to increase the overall efficiency and power output of the device 100. For instance, based on a bandgap of c-Si (e.g., 1.11 electron volts or eV), wavelengths in the orange and red visible region, as well as the near infrared region, should pass through (in the Y1 direction) the upper layer 110 to the bottom layer 130, such that the c-Si of the solar cell 134 receives light energy to convert to the electricity. According to one or more embodiments, the solar cell 134 can be a transmissive solar cell. In this regard, the rear section 136 can be reflective such that unabsorbed portions of the light exiting the solar cell 134 in the X1 direction can be reflected back along the X2 direction into the device 136.

According to one or more embodiments, the interim section 120 is an area of the device 100 where the transmissive solar cell 114 of the upper layer 110 and the transparent section 132 of the bottom layer 130 are adjacent. Adjacent in this context includes two components being next to, in contact with, or adjoining (e.g., effectively touching) without being bonded together, and in some cases being stacked directly on top of each other. The interim section 120 can be maintained by a seal or the like on a perimeter of the upper layer 110 and the bottom layer 130. The seal can include, but is not limited to, one or more of a glue or other adhesive, a gasket, a plastic member, and a gap filler. According to one or more embodiments, the seal is a combination of a gap filler and a glue or other adhesive. According to one or more embodiments, the interim section 120 is sealed on a perimeter to support the mechanical stacking of the upper layer 110 and the bottom layer 130, as well as to prevent foreign objects (e.g., dust, insects, rodents, or the like) from penetrating between the upper layer 110 and the bottom layer 130.

According to one or more embodiments, the interim section 120 is an area of the device 100 where the transmissive solar cell 114 of the upper layer 110 and the transparent section 132 of the bottom layer 130 are proximate to each other to form a space therebetween. Proximate in this context includes two components being near, close to, or at some predefined distance without being bonded together. Examples of proximate can include, but are not limited to, 1 millimeter, 5 millimeter, 1 centimeter, 5 centimeters, 1 decimeter, 5 decimeters, or the like. The space (i.e., the interim section 120) can be maintained by a seal as described herein and/or by a support structure. According to one or more embodiments, the support structure supports and secures the mechanical stacking of the upper layer 110 and the bottom layer 130, as well as provides the seal on one or more sides of the upper layer 110 and the bottom layer 130. Examples of the seal of the support structure include, but are not limited to, a screen, a water tight membrane, or an air filter. Example of mechanical stacking includes, but are not limited to, horizontal stacking, parallel stacking with a plane of a horizon (i.e., flat to the earth), and parallel stacking with a plane of an array (i.e., design determined).

According to one or more embodiments, the upper layer 110 can include, along with the transmissive solar cell 114, the transparent section 112 on a Y2 side (e.g., a sun side) of the transmissive solar cell 114. The bottom layer 130 can include, along with the solar cell 134, the transparent section 132 on a Y2 side (e.g., a sun side) of the solar cell 134 and/or the rear section 136 on a Y1 side (e.g., a side opposite the sun side) of the of the solar cell 134. As described herein, the rear section 136 can include metal, plastic, or other opaque material to prevent the light 102 or portions thereof from exiting the device 100 in the Y1 direction or to reflect the light 102 or portions thereof in the Y2 direction.

The transparent sections 112 and 132, as well as the rear section 136 in some embodiments, can include glass, plastic, or other transparent material that enable the light 102 or portions thereof to be passed without absorption. The rear section 136 can include metal, plastic, or other opaque material to prevent the light 102 or portions thereof from exiting the device 100 in the Y1 direction.

Figure 2:
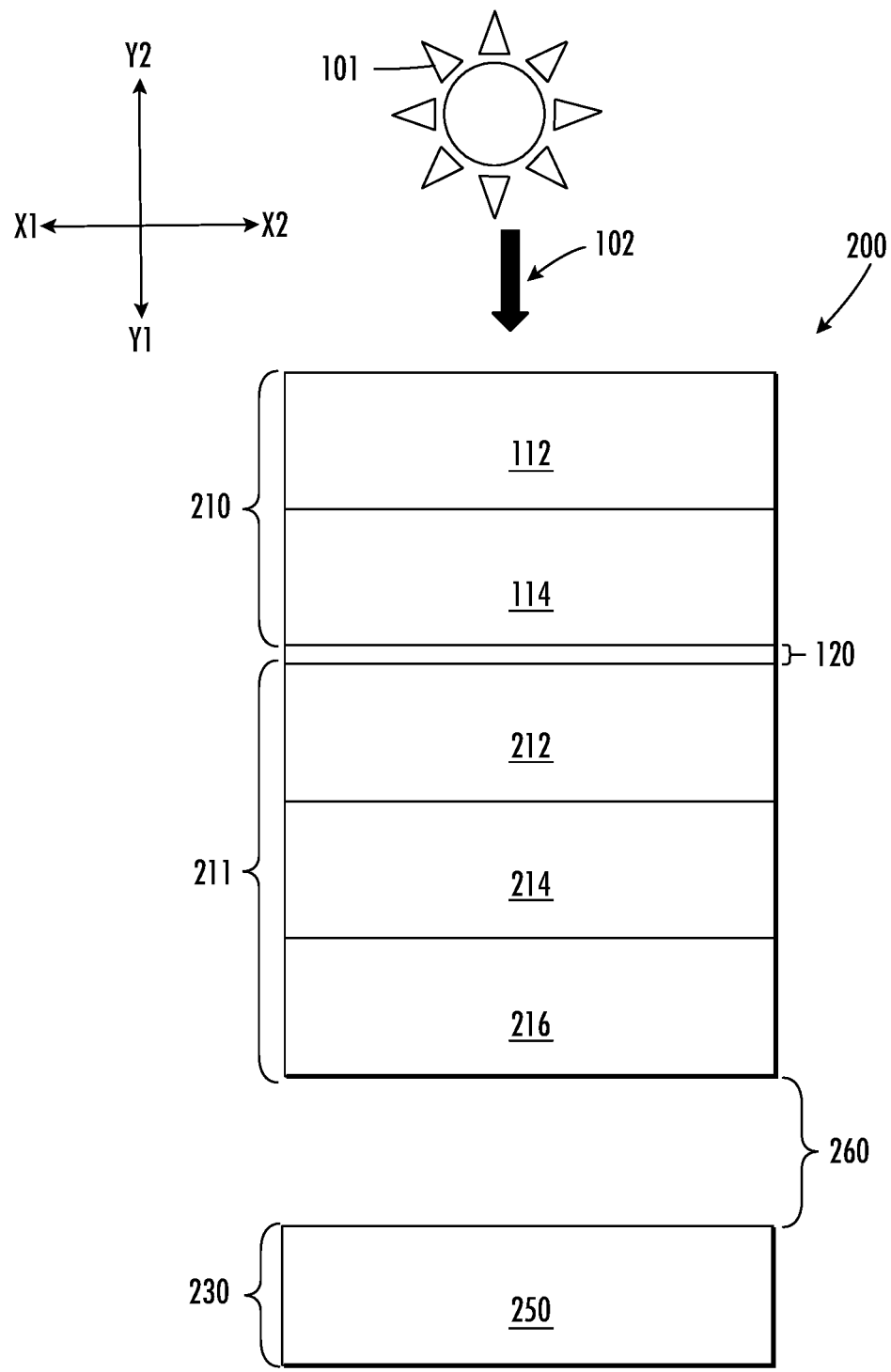
FIG. 2 depicts a device according to one or more embodiments.

FIG. 2 depicts a device 200 according to one or more embodiments. The device 200 is an example of a modular solar system. More particularly, the device 200 is an example of mechanically stacked solar transmissive cells.

Note that elements the modular solar system example of FIG. 2 that are similar to other FIGS. are reused for brevity (e.g., like reference numerals in the figures indicate like elements) and are not necessarily reintroduced. Thus, as shown, the device 200 additionally includes a first upper layer 210 and a second upper layer 211 that includes a top transparent section 212, a transmissive solar cell 214, and a bottom transparent section 216, as well as a bottom layer 230 that includes a reflective section 250. The second upper layer 211 and the bottom layer 230 can be separated by a distance 260. The amount of space of the interim section 120 and/or the distance 260 can be determined based on thermal coefficients of the device 200, in that spacing can be dictated by an optimal distance value that balances compactness of the device 200 and heat management of the layers 210, 211, and 230. In this way, the device 200 can include at least two mechanically stacked layers (e.g., at least the first upper layer 210 or the second upper layer 211), each of which can include at least one transmissive solar cell 114 and 214 (e.g., in some cases a plurality thereof). According to one or more embodiments, the interim section 120 and/or the distance 260 may signify that are the surrounding components are adjacent (e.g., may be stacked directly on top of each other).

According to one or more embodiments, the bottom transparent section 216 of the second upper layer 211 can be on a Y1 side of (e.g., a side opposite the sun side) of the transmissive solar cell 214. The first upper layer 210 can be referred to as a top layer of the two layers 210 and 211, while the second upper layer 211 can be referred to as a bottom layer of the two layers 210 and 211. The bottom layer 230 can be a reflective layer below the second upper layer 211. For instance, the bottom layer 230 can at least include the reflective section 250 that reflects unabsorbed portions of the light 102 exiting the bottom transparent section 216 in the Y1 direction back along the Y2 direction into the second upper layer 211. The reflective section 250 can include metal, plastic, or other opaque material that has a reflective Y2 surface. According to one or more embodiments, the transmissive solar cell 114 of the first upper layer 210 and the top transparent section 212 of the second upper layer 211 can be adjacent or proximate as described herein. Any portion of the device 200 can be sealed or supported as described herein. The interim section 120 can also represent a bottom transparent section of the first upper layer 210.

Figure 3:
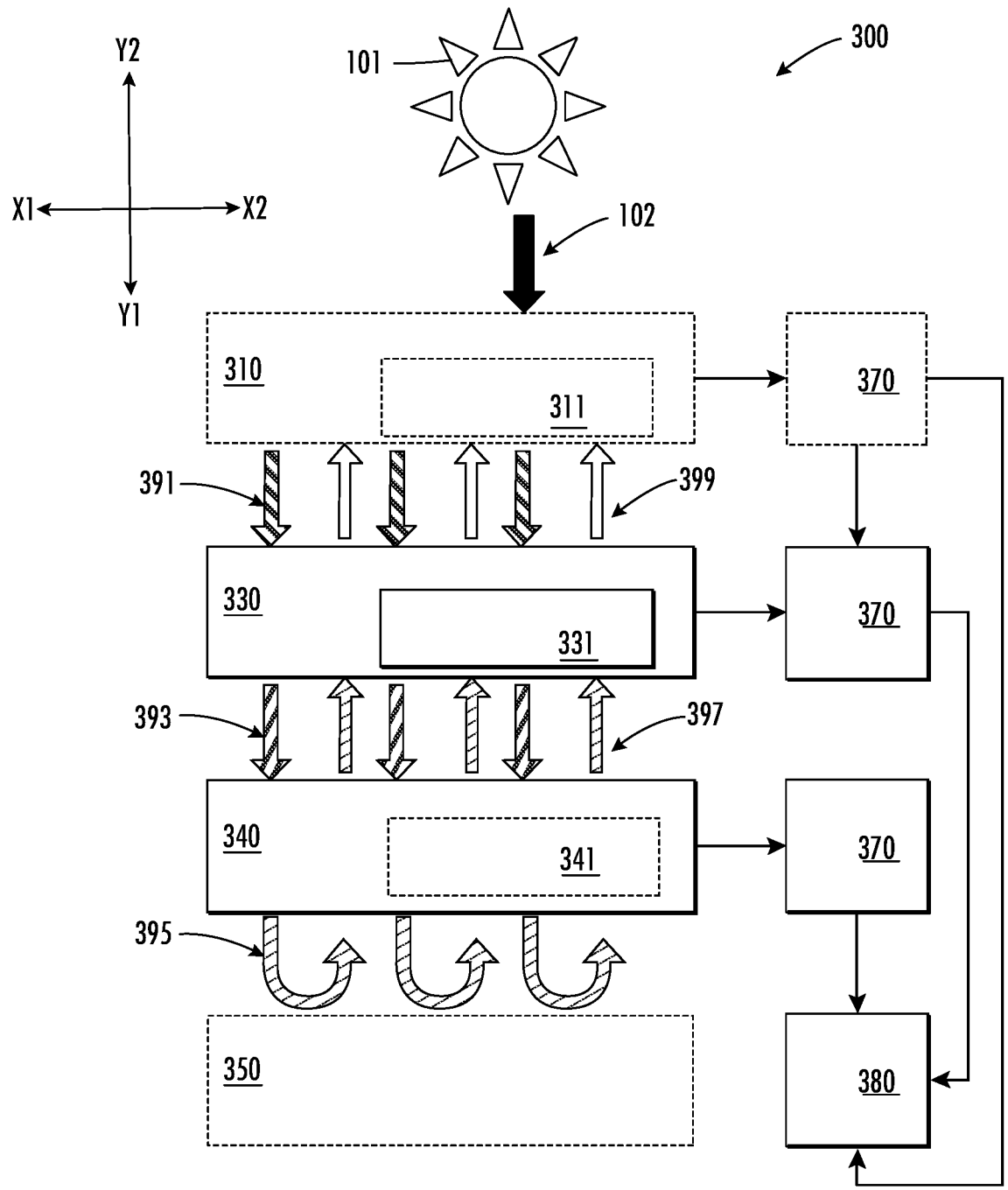
FIG. 3 depicts a system according to one or more embodiments.

FIG. 3 depicts a system 300 according to one or more embodiments. The system 300 receives, from at least the sun 101, the light 102 (though other sources are contemplated). The system 300 includes an optional module 310, with an optional transmissive solar cell 311; a transmissive module 330, with a transmissive solar cell 331; a module 340, with a solar cell 341 that can be optionally transmissive (e.g., the module 340 can be a transmissive module); an optional reflective module 350; one or more boxes 370, and a bus 380. Note that the optionality of any component or any feature is shown with a dotted border. The optional module 310 can be a concentrator, micro-concentrator, or a transmissive module. Each module is connected to the one or more boxes 370, which can be electrical combiner boxes (e.g., corresponding to strings of a support structures as described herein) that provide electricity generated by the one or more modules 310, 330, and 340 to the bus 380 (e.g., the PV bus connector and the PV connector box).

The one or more boxes 370 can be hard wired electrical connections that provide outlets, connections, or the like for receiving the one or more modules 310, 330, and 340. Note that the hard wired electrical connections can contain sensors, and the hard wired electrical connections can join wiring from separate modules. For example, each wiring harnesses of a module can protrude to a backside of each outlet to make installation, repairs, and maintenance easy (e.g., in a plug and play fashion). These hard wired electrical connections and outlets can be weatherproof quick connection hardware (e.g., used to connect wires to combiner boxes to simplify installation and reduce field quality errors). Fuses with in-use indication lights can be included with each hard wired electrical connection to ensure the modules are de-energized during installation and maintenance. Additionally, the operations of the system 300 can be monitored by one or more sensors as described herein.

The system 300 is an example of a modular solar system. More particularly, the system 300 is an example of mechanically stacked solar transmissive cells or modular apparatus. According to one or more embodiments, the system 300 includes at least two mechanically stacked modules, such as the optional module 310, the transmissive module 330, and the module 340. According to one or more embodiments, the optional module 310, the transmissive module 330, and the module 340 can be bi-facial (e.g., absorb light energy from either side) and include clear wiring to enable light energy to make multiple passes therethrough. The optional module 310 and the transmissive module 330 can be representative of one or more upper modules. The module 340 can be representative of a module layer, which can be the same or different from the one or more upper modules. The optional module 310 and the transmissive module 330 includes a plurality of transmissive solar cells (e.g., the optional transmissive solar cell 311 and the transmissive solar cell 331), which convert light energy received on a Y2 side (or a sun or first side) into electricity and pass unconverted portions of the light energy to a next module. For instance, the optional module 310 passes in a Y1 direction unconverted portions of the light energy to the transmissive module 330 on a Y2 side (or a sun or second side) of the optional module 310. Further, the transmissive module 330 passes in a Y1 direction unconverted portions of the light energy to the module 340 on a Y2 side (or a sun or second side) of the transmissive module 330.

Note that the module 340 includes a plurality of solar cells (e.g., the solar cell 341 can be optionally transmissive), which convert at least part of the unconverted portions of the light energy into electricity. The system 300 mechanically stacks of the at least two mechanically stacked modules to vertically align the plurality of solar cells of the module 340 with each of the plurality of transmissive solar cells of each of the optional module 310 and the transmissive module 330. According to one or more embodiments, the mechanical stacking by the system 300 can further be sealed on one or more sides, such as by a screen, a water tight membrane, or an air filter as described herein. Example of mechanical stacking includes, but are not limited to, horizontal stacking, parallel stacking with a plane of a horizon (i.e., flat to the earth), and parallel stacking with a plane of an array (i.e., design determined). By maintaining cells/modules mechanically and electrically separated, the one or more modules 310, 330, and 340 can be designed to work together for electrical aggregation (e.g., which further enables a broader electrical component scope to achieve power aggregation).

In operation, the sunlight 102 passes through one or more modules 310, 330, and 340. The module 310 can absorb the light 102 at a first wavelength at a first spectral response. Light 391 (i.e., irradiance thereof) that is outside of the first wavelength and in residual excess of the first spectral response outside the first wavelength is further passed in the Y1 direction to the transmissive module 330.

The transmissive module 330 can absorb the light 391 at a second wavelength at a second spectral response. According to one or more embodiments, the first and second wavelengths can be the same. According to one or more embodiments, the first spectral response and the second spectral response can also be the same. Light 393 (i.e., irradiance thereof) that is outside of the second wavelengths and in residual excess of the second spectral response outside the second wavelength is further passed in the Y1 direction to the module 340.

Figure 4:
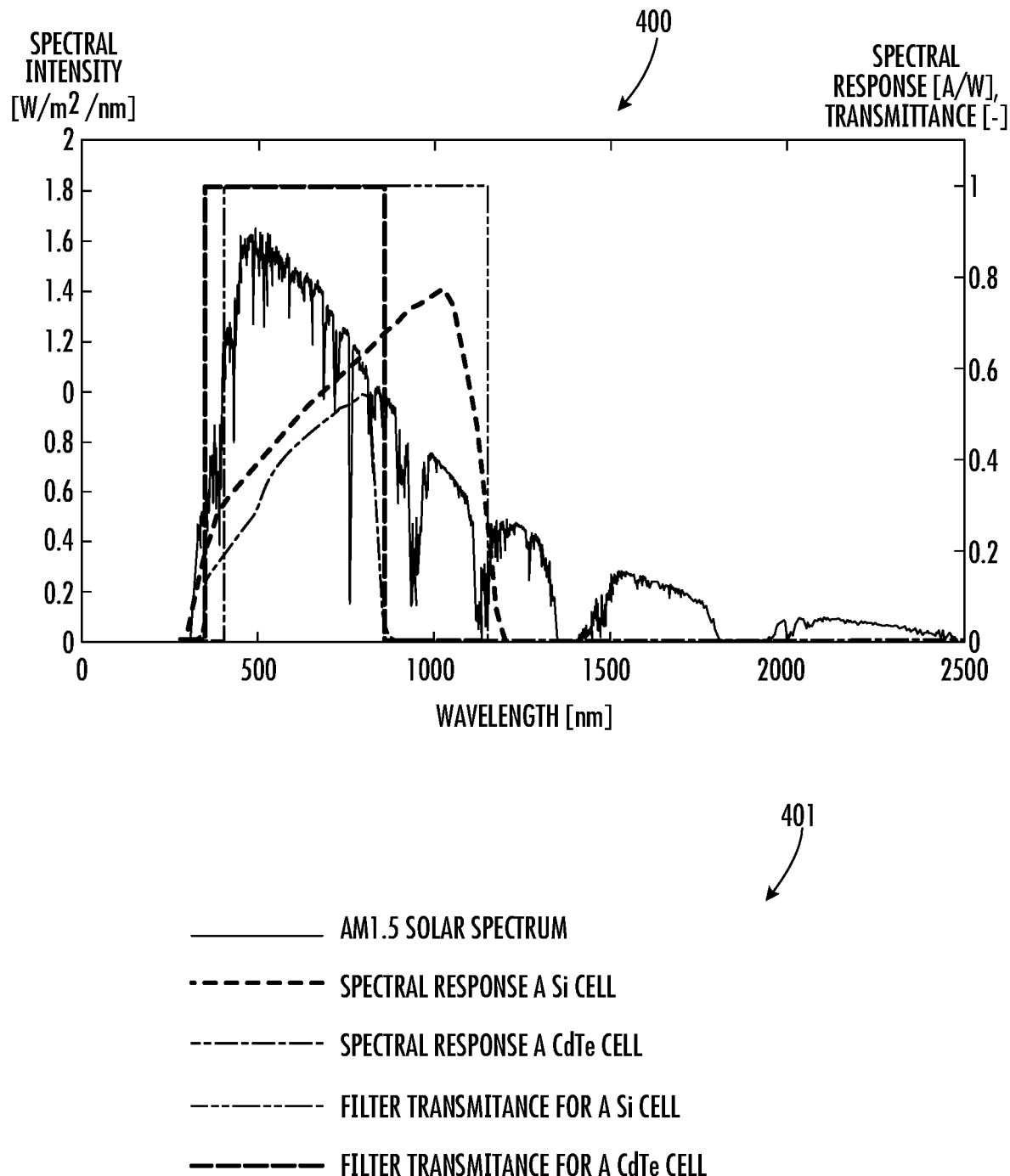
FIG. 4 depicts a graph according to one or more embodiments.

Turning to FIG. 4, a graph 400 is depicted according to one or more embodiments. The graph 400 is an example spectral response graph of CdTe (e.g., the transmissive solar cell 331 and the transmissive module 330) and c-Si (e.g., the solar cell 341 and the module 340). FIG. 4 also includes a key 401 identifying lines within the graph 400. The graph 400 includes an x-axis showing a nanometer scale for wavelength, as well as a left y-axis showing a spectral intensity and a right y-axis showing spectral response, transmittance. Note that the approximate absorption range for the CdTe is 400 to 800 nanometers (e.g., the second wavelength). For example, in the system 300, the transmissive module 330 absorbs irradiance of the light 391 in the 400 to 800 nanometer wavelength range and passes unabsorbed light energy in the wavelength range greater than 800 nanometers.

The module 340 can absorb the light 393 at a third wavelength at a third spectral response. According to one or more embodiments, the third wavelength can include and/or be wider than the second wavelength. Returning to FIG. 4, note that the approximate absorption range for the c-Si is 400 to 1200 nanometers (e.g., the second wavelength). The module 340 absorbs irradiance of the light 393 in at least the 800 to 1200 nanometer wavelength range and could pass light energy in the wavelength range greater than 1200 nanometers. The module 340 can also absorbs irradiance of the light 393 in the 400 to 1200 nanometer wavelength range, where the 400 to 800 nanometer wavelength range includes the light 393 (i.e., irradiance thereof) that is in residual excess of the second spectral response across the second wavelength. Further, light 395 (i.e., irradiance thereof) that is outside of the third wavelength and in residual excess of the third spectral response across the third wavelength is further passed in the Y1 direction to the reflective module 350.

The reflective module 350 reflects the light 395 in the Y2 direction back to the module 340. Any remaining irradiance of the light 395 can further be absorbed by the module 340 or passed as light 397 to the transmissive module 330 (e.g., the light 397 continues in the Y2 direction). Next, any remaining irradiance of the light 397 can further be absorbed by the transmissive module 330 or passed as light 399 to the module 310 (e.g., the light 399 continues in the Y2 direction). Note the fading of the arrows representing the light 102, 391, 393, 395, 397, and 399 illustrate the absorption of irradiance and descries of energy, as the light 102 is converted to electricity that is sent to the boxes 370. Note also that each a particular irradiance or portion thereof may not be absorbed on a first pass and may be absorbed on a second pass (i.e., in the Y2 direction).

Figure 5:
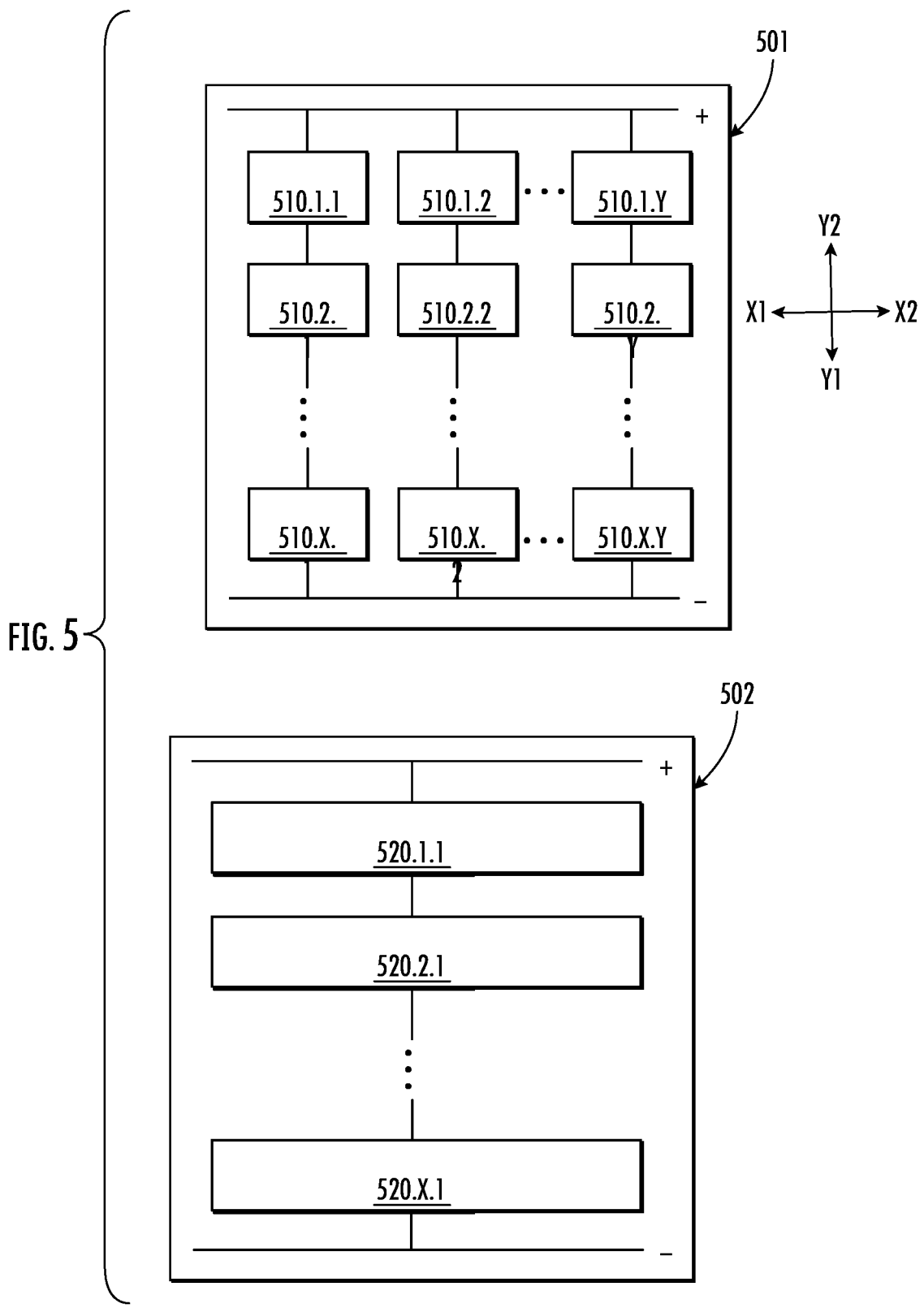
FIG. 5 depicts modules according to one or more embodiments.

FIG. 5 depicts modules 501 and 502 according to one or more embodiments. The modules 501 and 502 can be an example configuration of any of the modules 330 and 340 (or layers) discussed herein. The module 501 includes one or more cells 510 arranged in an x-y grid, where both x and y are integers greater than 0. The module 502 includes one or more cells 520 arranged in an x-y grid, where x is 1 and y is an integer greater than 0. The width, wiring, configuration of cells 510 and 520 can be managed and operated to control power generation on a per cell basis.

Figure 6:
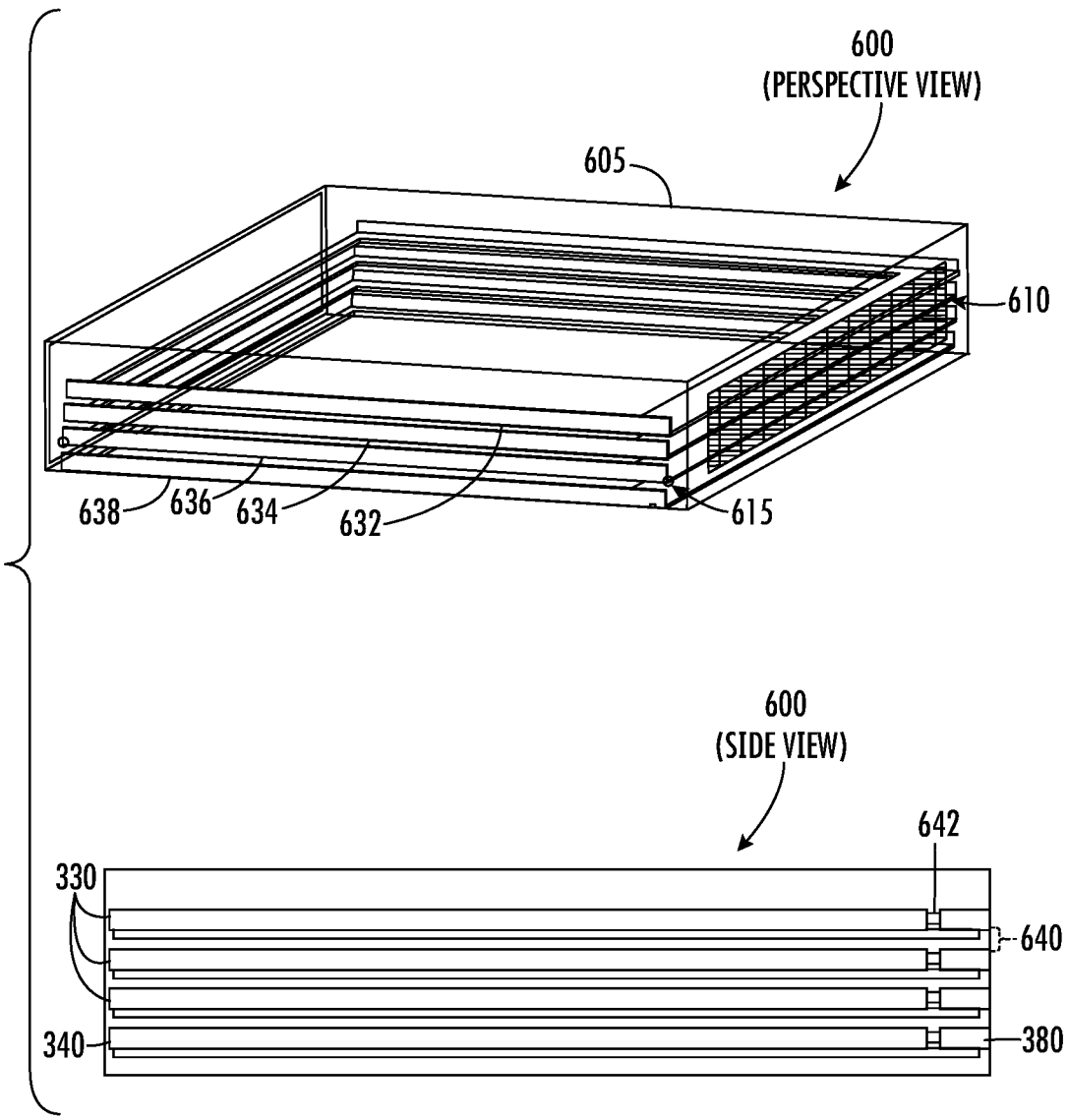
FIG. 6 depicts a frame according to one or more embodiments.

FIG. 6 depicts a frame 600 according to one or more embodiments. The frame 600 is shown from a perspective view and a side view through side walls thereof. The frame 600 includes a shell 605, a vent grate or opening 610, a hole 615 (e.g., to accept a fastener to attach to the frame 600 to a frame), and one or more shelves 632, 634, 636, and 638.

The one or more shelves 632, 634, 636, and 638 can be spacer shelves for the modules 330 and 340 and the boxes 380 to hold these components in a vertical stack, with spaces 640 therebetween allowing for airflow, cooling. etc. The one or more shelves 632, 634, 636, and 638 can be brackets, L-shaped flanges, or the like that provide a plurality of levels within the frame 600, such as a top level 632, a top-middle level 634, a bottom-middle level 636, and a bottom level 638. Note that the shelves 632, 634, 636, and 638 enable spaces 640 between the modules 330 and 340. Further, note that each of the modules 330 and 340 includes a connector 642 that electrically couples that module 330 and 340 with a corresponding box 380.

According to one or more embodiments, the frame 600 secures a mechanical stacking of the modules 330 and 340 (e.g., thereby providing an alternative design to tandem cells by way of a mechanically stacked configuration that is not bonded). According to one or more embodiments, the frame 600 is a frame and rail system where the one or more shelves 632, 634, 636, and 638 act as horizontal slider tracks that the modules 330 and 340 lay upon. Note that the frame 600 can include an open top (e.g., so the light 102 can cast onto any modules 330 and 340 therein) and an open bottom, as well as vent grate or opening 610 or open walls to allow to direct airflow. The frame 600 or any parts thereof can be made of metal, wood, plastic, fiber glass, carbon fiber or other structural materials as described herein.

Figure 7:
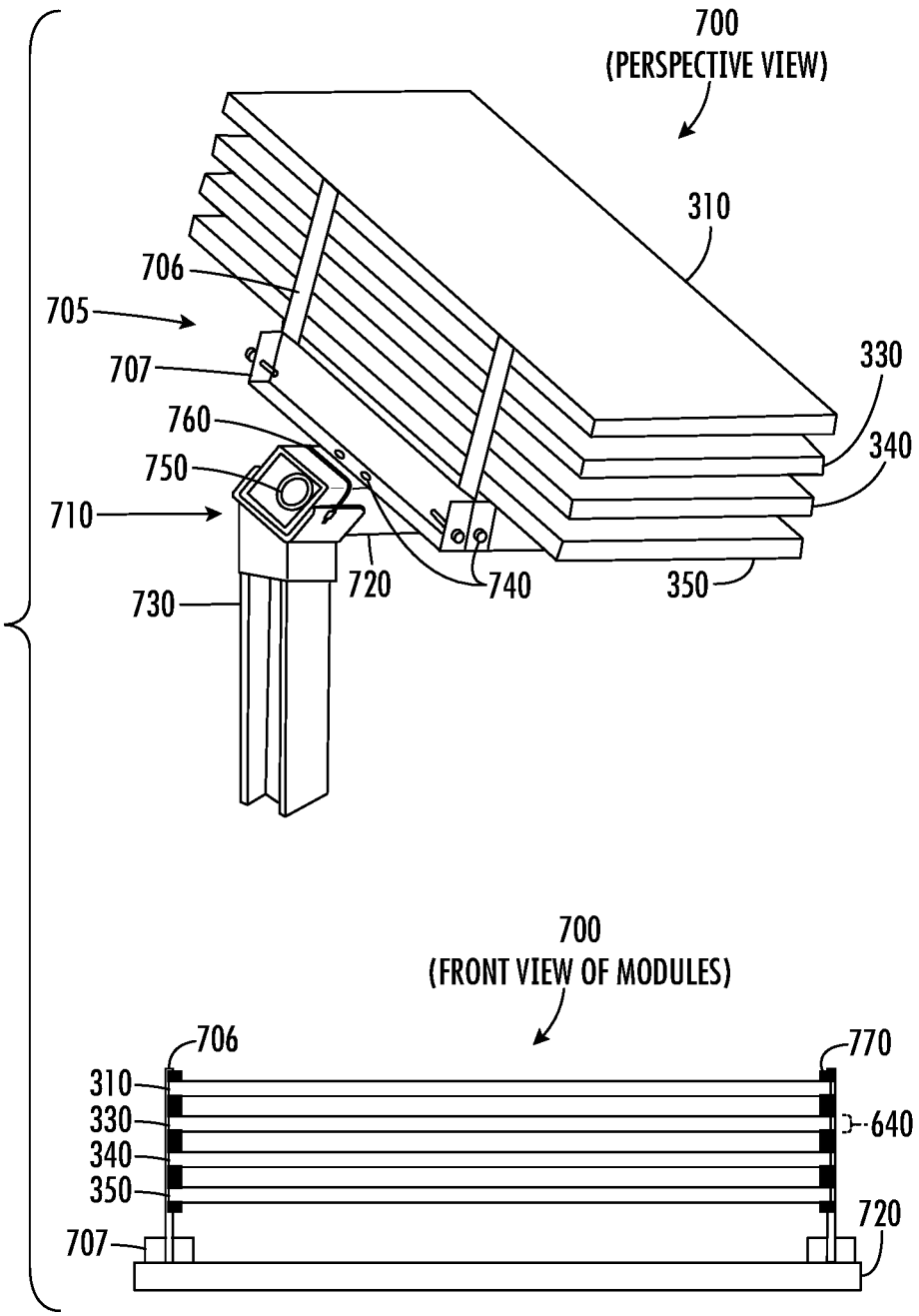
FIG. 7 depicts a support structure according to one or more embodiments.

FIG. 7 illustrates a support structure 700 according to one or more embodiments. The support structure 700 is shown from a perspective view and a front view through side walls thereof. The support structure 700 includes a frame 705 including one or more arms 706 and one or more holders 707. The support structure 700 includes a cap 710, a beam arrangement 720, and a post 730. The support structure 700 includes one or more fasteners 740 (e.g., cotter pins and/or screws), a conduit 750, and one or more straps 760.

The one or more holders 707 secure the one or more arms 706 in place. The one or more holders 707 can be secured by the fasteners 740 to the arms 705 and to the beam arrangement 720. The beam arrangement 720 can be one or more beams. The one or more beams of the beam arrangement 720 can be square beams, round beams, I-beams, or other structural member with variable angles. The beam arrangement 720 supports the one or more frames 705 that further support one or more modules 310, 330, 340, and 350 as discussed herein. In this regard, the one or more modules 310, 330, 340, and 350 (e.g., the modules 501 and/or 501 of FIG. 5) can be mounted within the arms 706 of the support structure 700 of FIG. 7 so that the one or more modules 310, 330, 340, and 350 are mechanically stacked in an adjacent and/or proximate configuration. The support structure 700 can includes wedges 770, such as metal, plastic, or rubber wedges to keep the one or more modules 310, 330, 340, and 350 in place within the arms 706.

The strap 760 can be adjustable to keep the beam arrangement 720 in place on the cap 710. The cap 710 can be a post cap for the post 730, and include a U-bracket set to an angle from the post 730 as shown in FIG. 7. The post 730 can be a square beam, round pipe, channel member, or I-beam fixed to, mounted on, and/or partially buried in the ground or other surface. The conduit 750 can house electrical wiring, such as strings as described herein. If a channel is used for the one or more components or portions of the support structure 700, the electrical wiring can be placed directly in the channel.

According to one or more embodiments, the support structure 700 secures a mechanical stacking of the modules 310, 330, 340, and 350 (e.g., thereby providing an alternative design to tandem cells by way of a mechanically stacked configuration that is not bonded). According to one or more embodiments, the one or more frames 705 can be a snap button and slot system or perimeter mold system where the arms 706 and the holders 707 secure or clamp the modules 310, 330, 340, and 350 into place. The holders 707 can be spacer clamps for the arms 706, which hold the modules 310, 330, 340, and 350 in a vertical stack, with spaces 640 as described herein. The wedges 770 can be clear and/or rubber components that support the insertion of the modules 310, 330, 340, and 350. According to one or more embodiments, the perimeter mold system can include a perimeter mold along an outer edge of each of the modules 310, 330, 340, and 350, each perimeter mold configured to stack with an adjacent perimeter mold. The support structure 700 can also include wedges, such as rubber wedges to keep the beam 720 in place within the cap 710. Note that any component of the support structure 700, as well as the modules 310, 330, 340, and 350, can be shipped separately and assembled in the field.

Figure 8:
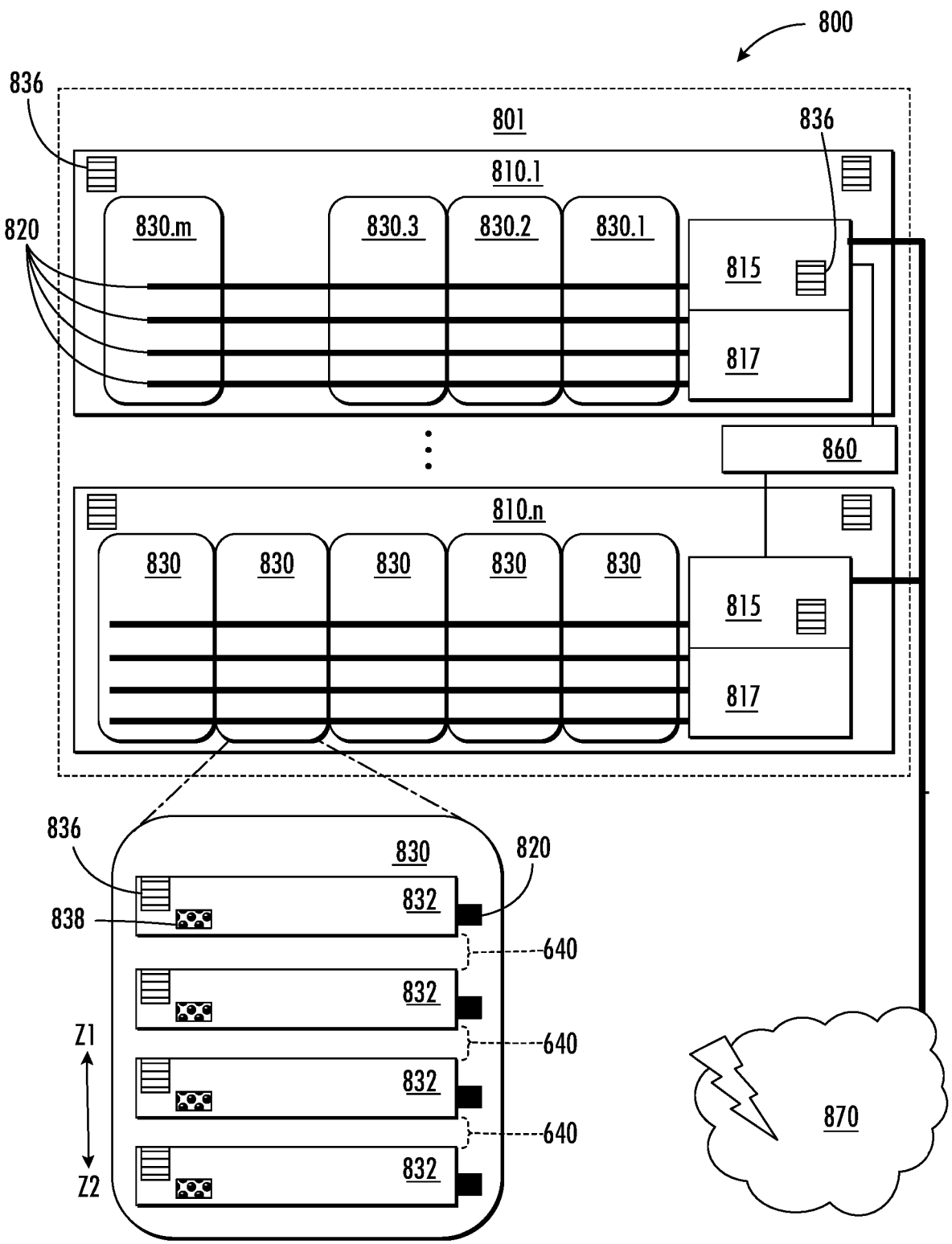
FIG. 8 depicts an environment according to one or more embodiments.

Turning now to FIG. 8, an environment 800 is illustrated according to one or more embodiments. The environment 800 can include one or more modular solar systems as discussed herein. More particularly, the environment 800 can include one or more mechanically stacked solar transmissive modules within one or more apparatuses to receive light (e.g., from at least the sun 101, though other sources are contemplated). In this way, embodiments of the environment 800 include apparatuses, systems, methods, and/or computer program products at any possible technical detail level of integration.

According to one or more embodiments, the environment 800 can be representative of the modular solar system located within a field 801 and including one or more support structures 810.n (where n is an integer). The field 801 can be any terrain or expanse of open or cleared ground for supporting the one or more support structures 810.n, as well as rooftops and/or other property areas.

Each support structure 810 includes at least an inverter 815, a switch 817, a string 820, and one or more modular apparatuses 830 (where m is an integer). Each modular apparatus 830 (e.g., the devices 100 and 200 of FIGS. 1-2) can include the one or more modules 832 (e.g., the layers 110, 130, 230, and 250 of FIGS. 1-2).

The inverter 815 can be any power electronic device or circuitry that changes between currents, such as direct current (DC) to alternating current (AC). The switch 817 can be a de-energizing switch that grounds each support structure 810. According to one or more embodiments, the switch 817 provides electrical latching, when the support structures 810 is energized, and prevents ejection. The string 820 can be any electronic configuration that connects one or more electrical components (e.g., the one or more modules 832), whether in series or in parallel to a particular electrical component (e.g., such as the inverter 815).

Each module 832 is connected to a corresponding string 820 (e.g., via a pin connection, a pig tail connection, or the like), is separated by the space 640 (e.g., the interim section 120 of FIG. 1 or distance 250 of FIG. 2) from at least another module 832, and has at least one sensor 836 and a code 838. Further, additional sensors 836 can be located through the support structures 810 and the environment 800. The environment 800 and elements therein (e.g., any of the sensors 836) can be managed a device 860. Further, the environment 800 can be connected to a grid 870 and can be managed by a maintenance robot, a drone, a technician, or the like.

According to one or more embodiments, the support structure 810 and the modular apparatuses 830 can be assembled in a factory setting, including pre-wiring to reduce field assembly costs in the field 801 while increasing quality. When the modular apparatuses 830 are shipped to the field 801, the modular apparatuses 830 can be connected together and then erected like a puzzle with respect to the fames 810. The one or more modular apparatuses 830 can have dimensions to accommodate modules 832 (e.g., 1×2 meters in length and width) and to provide spacing that accommodates cooling and bandgap distribution. According to one or more embodiments, 1 inch high modules with 1 inch spacing therebetween provides an 8 inch high module (e.g., that may look like a pancake stack). In turn, the support structure 810 can provide lateral stability side to side, while the module 830 provides stability front to back stability. According to one or more embodiments, the modules 832 can be adjacent (e.g., may be stacked directly on top of each other without spacing therebetween).

According to one or more embodiments, the environment 800 is a system of support structures 810, modular apparatuses 830, and at least two mechanically modules 832 in the field 801 with sensors 836. The environment 800 illustrates, on a macro level, how elements and things are connected within a greater network for alerts, as well as to provide electricity the grid 870 or other load (e.g., one or more batteries). The at least two mechanically modules 832 include a bottom module and one or more upper modules as described herein. Each string 820 corresponds and electrically connects to one of the at least two mechanically staked modules 832 to receive the electricity therefrom. Each string 820 is electrically distinct from other strings 820. The support structures 810 securing a mechanical stacking of the at least two mechanically stacked modules 832 to vertically align the plurality of solar cells and/or transmissive solar cells of the at least two mechanically modules 832.

According to one or more embodiments, the environment 800 can also include a uniform design, where the modules 832 are connected in series or parallel. For example, each cell of a module 832 can provide 1.5 volts. Further, 32 cells can be connected in series within each module 832 that are further connected in series per string 820 (e.g., 18 modules 832 in series per string 820 provides 864 volts). The inverters 815 can combine 32 strings 820 in parallel to produce a high current that is provided to the grid 870. According to one or more embodiments, the environment 800 can also include a tiered design, where the modules 832 of the one or more strings 820 are connected in parallel, the modules 832 of the one or more strings 820 are connected in series, and/or a combination thereof (e.g., a collection of tiers managed in a hybrid environment).

The support structure 810 can be a pre-wired modular racking system that incorporates one or more technology aspects (e.g. modular DC optimizers) described herein. According to one or more embodiments, the support structure 810 can be an aggregation of the one or more modular apparatuses 830 thereof. A structure of the support structure 810 can be made of carbon fiber, steel, metal, alloy, wood, plastic, fiberglass, or any combination thereof. According to one or more embodiments, the support structure 810 can be a "smart rack" system given the sensors 836 and an ability to be communicatively coupled to the device 860.

The modular apparatus 830 (e.g., a framework or stacking structure) can be any integrated system that provides three dimensional solar system applications. According to one or more technical effects, advantages, and benefits, the modular apparatus 830 enable the modules 832 to be easily moved, replaced, and/or exchanged, such as for future generation modules 832. The modular apparatus 830 stacks the modules 832 vertically to maximize a solar energy captured per square meter of surface area. Further, a vertical aspect of ordering the modules 832 within the modular apparatus 830 enables capturing each bandgap, cooling, spacing, etc. According to one or more embodiments, the modular apparatus 830 can utilize a shell or casing that holds multiple solar modules placed on top of another, with the space 640 therebetween allowing for airflow for cooling or without a space. According to one or more embodiments, a top solar module can be a concentrator or micro-concentrator, one or more middle modules can be one or more transmissive modules, and a bottom module can capture any remaining light energy (e.g., infrared radiation) or be reflective. Note that, in an example, the modular apparatus 830 stacks four layers of modules 832, where each module 832 corresponds to one of the strings 820.

According to one or more technical effects, advantages, and benefits, the modular apparatus 830 enables single p-n junction cells (which are cost effective compared to other technologies) to be layered in a stacking structure, which emulates a tandem cell concept without bonding the modules 832 and keeping layers electricity distinct. Further, according to one or more technical effects, advantages, and benefit, the modular apparatus 830 provides improved modularization that facilitates easy field installation to reduce a balance of plant (BOP) cost structure. For example, solar module prices currently correspond to approximately $0.40 per watt for a utility-scale solar power project cost in the United States of America and include diminishing returns in solar cell cost reductions. Also, BOP cost reductions have made very little progress with conventional solar technologies and have not dropped proportionally as conventional solar technologies advance. Different government agencies target the overall cost threshold for a solar power plant at $0.50 per watt (DC) to be cost-competitive with traditional fossil fuels. This goal is only achievable if there are significant improvements with BOP costs. A way to accomplish this goal is by increasing sunlight capture density per land surface area, thereby decreasing electrical production costs by spreading BOP costs over higher kWh of power production. Further, according to one or more technical effects, advantages, and benefit, the modular apparatus 830 is more feasible for homes and commercial buildings where rooftops and property areas are limited. In turn, the modular apparatus 830 can make buildings Net Zero electricity consumers and virtually taken off the grid 870. Further, according to one or more technical effects, advantages, and benefit, the environment 800 can salvage infrastructure while having the flexibility to harness future technological improvements (e.g., a solar lifespan averages at 15 years; while in contrast the environment 800 can now extend that lifespan to greater than 50 years).

Figure 9:
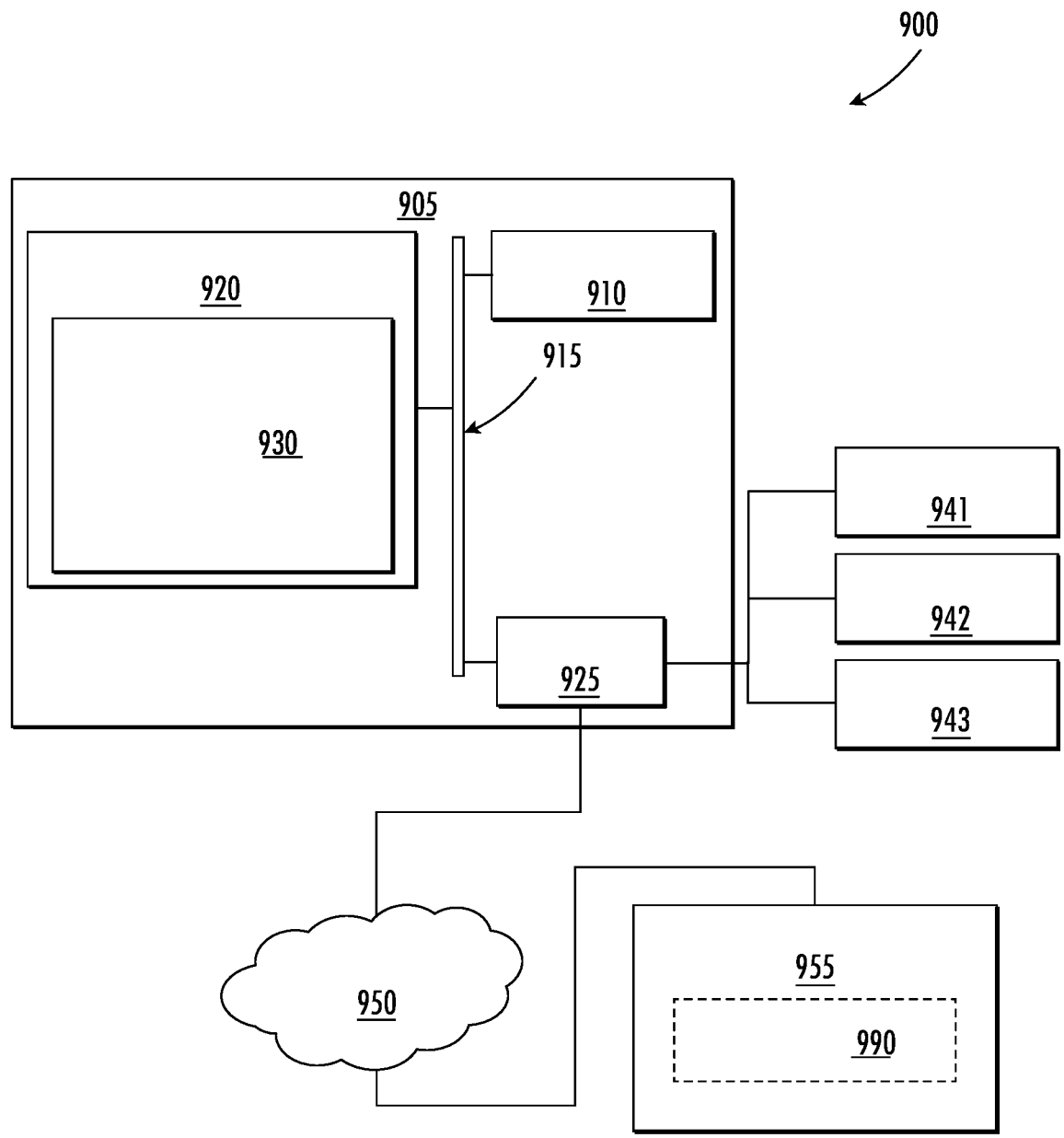
FIG. 9 depicts a system according to one or more embodiments.

Turning now to FIG. 9, a computing system 900 is illustrated according to one or more embodiments. The computing system 900 can be representative of any computing device, computing apparatus, and/or computing environment, which comprise hardware, software, or a combination thereof. Further, embodiments of the computing system 900 disclosed may include apparatuses, systems, methods, and/or computer program products at any possible technical detail level of integration. In general, the computing system 900 of FIG. 9 operates to monitor at least the device 100 of FIG. 1 and components therein. For instance, the computing system 900 can detect anomalies, degradations, operations, and the like to, as well as coordinate with other systems and data of those systems (e.g., weather data), to accept, process, and extrapolate (e.g., using big data operations with respect to machine learning and artificial intelligence) at least a health of the device 100 of FIG. 1 and components therein.

The computing system 900 has a device 905 (e.g., the device 860 of FIG. 8) with one or more central processing units (CPU(s)), which are collectively or generically referred to as a processor 910. The processor 910, also referred to as processing circuits, is coupled via a system bus 915 to a system memory 920 and various other components. The computing system 900 and/or the device 905 may be adapted or configured to perform as an online platform, a server, an embedded computing system, a personal computer, a console, a personal digital assistant (PDA), a cell phone, a tablet computing device, a quantum computing device, cloud computing device, a mobile device, a smartphone, a fixed mobile device, a smart display, a wearable computer, or the like.

The processor 910 may be any type of general or specific purpose processor, including a central processing unit (CPU), application specific integrated circuit (ASIC), field programmable gate array (FPGA), graphics processing unit (GPU), controller, multi-core processing unit, three dimensional processor, quantum computing device, or any combination thereof. The processor 910 may also have multiple processing cores, and at least some of the cores may be configured to perform specific functions. Multi-parallel processing may also be configured. In addition, at least the processor 910 may be a neuromorphic circuit that includes processing elements that mimic biological neurons.

The system bus 915 (or other communication mechanism) is configured for communicating information or data to the processor 910, the system memory 920, and various other components, such as an adapter 925.

The system memory 920 is an example of a (non-transitory) computer readable storage medium, where software 930 can be stored as software components, modules, engines, instructions, or the like for execution by the processor 910 to cause the device 905 to operate, such as described herein. The system memory 920 can include any combination of a read only memory (ROM), a random access memory (RAM), internal or external Flash memory, embedded static-RAM (SRAM), solid-state memory, cache, static storage such as a magnetic or optical disk, or any other types of volatile or non-volatile memory. Non-transitory computer readable storage mediums may be any media that can be accessed by the processor 910 and may include volatile media, non-volatile media, or the like. For example, the ROM is coupled to the system bus 915 and may include a basic input/output system (BIOS), which controls certain basic functions of the device 905, and the RAM is read-write memory coupled to the system bus 915 for use by the processors 910. Non-transitory computer readable storage mediums can include any media that is removable, non-removable, or the like.

According to one or more embodiments, the software 930 can be configured in hardware, software, or a hybrid implementation. The software 930 can be composed of modules that are in operative communication with one another, and to pass information or instructions. According to one or more embodiments, the software 930 can provide one or more user interfaces, such as on behalf of the operating system or other application and/or directly as needed. The user interfaces include, but are not limited to, graphic user interfaces, window interfaces, internet browsers, and/or other visual interfaces for applications, operating systems, file folders, and the like. Thus, user activity can include any interaction or manipulation of the user interfaces provided by the software 930. The software 930 can further include custom modules to perform application specific processes or derivatives thereof, such that the computing system 900 may include additional functionality. For example, according to one or more embodiments, the software 930 may be configured to store information, instructions, commands, or data to be executed or processed by the processor 910 to logically implement the methods described herein (e.g., big data operations with respect to machine learning and artificial intelligence). The software 930 of FIG. 9 can also be representative of an operating system, a mobile application, a client application, and/or the like for the device 905 for the computing system 900.

The adapter 925 can be representative of one or more adapters of the device 905, such as an input/output (I/O) adapter, a device adapter, and/or a communications adapter. According to one or more embodiments, the adapter 925 may be connected to one or more I/O buses that are connected to the system bus 915 via an intermediate bus bridge. Suitable I/O buses for connecting peripheral devices such as hard disk controllers, network adapters, and graphics adapters typically include common protocols, such as the Peripheral Component Interconnect (PCI).

According to one or more embodiments, the I/O adapter can be configured as a small computer system interface (SCSI), of in view of frequency division multiple access (FDMA) single carrier FDMA (SC-FDMA), time division multiple access (TDMA), code division multiple access (CDMA), orthogonal frequency-division multiplexing (OFDM), orthogonal frequency-division multiple access (OFDMA), global system for mobile (GSM) communications, general packet radio service (GPRS), universal mobile telecommunications system (UMTS), cdma2000, wideband CDMA (W-CDMA), high-speed downlink packet access (HSDPA), high-speed uplink packet access (HSUPA), high-speed packet access (HSPA), long term evolution (LTE), LTE Advanced (LTE-A), 802.11x, Wi-Fi, Zigbee, Ultra-WideBand (UWB), 802.16x, 802.15, home Node-B (HnB), Bluetooth, radio frequency identification (RFID), infrared data association (IrDA), near-field communications (NFC), fifth generation (5G), new radio (NR), or any other wireless or wired device/transceiver for communication.

According to one or more embodiments, the device adapter interconnects input/output devices to the system bus 915, such as a display 941, a sensor 942, a controller 943, or the like (e.g., a camera, a speaker, etc.).

The display 941 is configured to provide one or more UIs or graphic UIs (GUIs) that can be captured by and analyzes by the software 930, as the users interacts with the device 905. Examples of the display 941 can include, but are not limited to, a plasma, a liquid crystal display (LCD), a light emitting diode (LED), a field emission display (FED), an organic light emitting diode (OLED) display, a flexible OLED display, a flexible substrate display, a projection display, a 4K display, a high definition (HD) display, a Retina© display, an in-plane switching (IPS) display or the like. The display 941 may be configured as a touch, three dimensional (3D) touch, multi-input touch, or multi-touch display using resistive, capacitive, surface-acoustic wave (SAW) capacitive, infrared, optical imaging, dispersive signal technology, acoustic pulse recognition, frustrated total internal reflection, or the like as understood by one of ordinary skill in the art for input/output (I/O).

The sensor 942, such as any transducer configured to convert one or more environmental conditions into an electrical signal, may be further coupled to the system bus 915 for input to the device 905. In addition, one or more inputs may be provided to the computing system 900 remotely via another computing system (e.g., the computing system 955) in communication therewith, or the device 905 may operate autonomously. For example, the sensor 942 can include one or more of an electrode, a temperature sensor (e.g., thermocouple), a current sensor, a photosensor, an accelerometer, a microphone, a radiation sensor, a proximity sensor, position sensor, and a long range (LoRa) sensor (e.g., any low-power wide-area network modulation sensor). According to one or more embodiments, the sensors 942 can be installed at each level and integrated into an environment (e.g., sensors 845 of the environment 800 of FIG. 8) to monitor operations therein, such as identify when a specific module (e.g., module 832 of the environment 800 of FIG. 8) is not functioning correctly. For example. when a module's electric current falls below a defined threshold, the sensors 942 (e.g., electric current sensors) send a signal to the software 930 to identify a malfunctioning module's exact location. Each sensor 942 comprises a serial number that can be matched with each modules/modular apparatuses/frames/etc. (e.g., as identified on a scannable code) and corresponding level of the environment (e.g., environment 800 of FIG. 8).

The controller 943, such as a computer mouse, a touchpad, a touch screen, a keyboard, a keypad, or the like, may be further coupled to the system bus 915 for input to the device 905. In addition, one or more inputs may be provided to the computing system 900 remotely via another computing system (e.g., the computing system 955) in communication therewith, or the device 905 may operate autonomously. The controller 943 can also be representative of one or more actuators or the like for moving, locking, unlocking portions of the environment (e.g., environment 800 of FIG. 8).

According to one or more embodiments, the communications adapter interconnects the system bus 915 with a network 950, which may be an outside network, enabling the device 905 to communicate data with other such devices (e.g., such a computing system 955 through the network 950).

According to one or more embodiments, the functionality of the device 905 with respect to the software 930 can also be implemented on the computing system 955, as represented by separate instances of the software 990. Note that the software 990 can be stored in a common repository located at the device 905 and/or the computing system 955 and can be downloaded (on demand) to and/or from each of the device 995 and/or the computing system 955.

According to one or more embodiments, a device is provided. The device includes at least two mechanically stacked layers including a bottom layer and one or more upper layers. Each of the one or more upper layers includes at least one transmissive solar cell configured to convert light energy into electricity and pass unconverted portions of the light energy towards the bottom layer. The bottom layer includes at least one solar cell configured to convert at least part of the unconverted portions of the light energy into electricity.

According to one or more embodiments or any of the device embodiments herein, the at least one solar cell of the bottom layer can include a transmissive solar cell.

According to one or more embodiments or any of the device embodiments herein, the device can include a reflective layer below the bottom layer.

According to one or more embodiments or any of the device embodiments herein, each of the at least two mechanically stacked layers can be electrically distinct from other layers of the at least two mechanically stacked layers.

According to one or more embodiments or any of the device embodiments herein, the one or more upper layers can include a first upper layer comprising the at least one transmissive solar cell and a transparent section on a sun side of the transmissive solar cell.

According to one or more embodiments or any of the device embodiments herein, the bottom layer can include a top transparent section on a sun side of the at least one solar cell and a rear section on a side opposite the sun side.

According to one or more embodiments or any of the device embodiments herein, the at least one transmissive solar cell of the first upper layer and the top transparent section of the bottom layer can be adjacent.

According to one or more embodiments or any of the device embodiments herein, the first upper layer and the bottom layer can be sealed on a perimeter of the at least two mechanically stacked layers.

According to one or more embodiments or any of the device embodiments herein, the first upper layer can include a bottom section on a side opposite the sun side.

According to one or more embodiments or any of the device embodiments herein, the bottom section of the first upper layer and the top transparent section of the bottom layer can be adjacent.

According to one or more embodiments or any of the device embodiments herein, the bottom layer and the first upper layer can be proximate to each other to form a space therebetween.

According to one or more embodiments or any of the device embodiments herein, the space can be sealed on a perimeter of the at least two mechanically stacked layers by a gap filler and a glue.

According to one or more embodiments or any of the device embodiments herein, the space can be sealed on a perimeter of the at least two mechanically stacked layers by a screen, a water tight membrane, or an air filter.

According to one or more embodiments or any of the device embodiments herein, the device can further include a support structure securing a mechanical stacking of the at least two mechanically stacked layers.

According to one or more embodiments or any of the device embodiments herein, the support structure can include a frame and rail system.

According to one or more embodiments or any of the device embodiments herein, the support structure can include a snap button and slot system.

According to one or more embodiments or any of the device embodiments herein, the support structure can include a perimeter mold along an outer edge of the each of the at least two mechanically stacked layers, each perimeter mold can be configured to stack with an adjacent perimeter mold.

According to one or more embodiments, a modular apparatus is provided. The modular apparatus includes at least two mechanically stacked modules including a module layer and one or more upper modules. Each of the one or more upper modules includes a plurality of transmissive solar cells configured to convert light energy received on a first side into electricity and pass unconverted portions of the light energy to a next module of the at least two mechanically stacked modules on a second side. The bottom module includes a plurality of solar cells configured to convert at least part of the unconverted portions of the light energy into electricity.

According to one or more embodiments or any of the modular apparatus embodiments herein, the mechanical stacking of the at least two mechanically stacked modules can vertically align the plurality of solar cells of the bottom module with each of the plurality of transmissive solar cells of each of the one or more upper modules.

According to one or more embodiments, a system is provided. The system includes a plurality of modular apparatuses. Each modular apparatus includes at least two mechanically stacked modules. The at least two mechanically stacked modules includes a bottom module and one or more upper modules. Each of the one or more upper modules includes a plurality of transmissive solar cells configured to convert light energy into electricity and pass unconverted portions of the light energy towards the bottom modules. The bottom modules includes a plurality of solar cells configured to convert at least part of the unconverted portions of the light energy into electricity. The system includes at least two strings. Each string corresponds and electrically connects to one of the at least two mechanically staked modules to receive the electricity therefrom. Each string is electrically distinct from other strings. The system includes a support structure securing a mechanical stacking of the at least two mechanically stacked modules to vertically align the plurality of solar cells of the bottom module with each of the plurality of transmissive solar cells of each of the one or more upper modules.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Although features and elements are described above in particular combinations, one of ordinary skill in the art will appreciate that each feature or element can be used alone or in any combination with the other features and elements. In addition, the methods described herein may be implemented in a computer program, software, or firmware incorporated in a computer-readable medium for execution by a computer or processor. A computer readable medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire Examples of computer-readable media include electrical signals (transmitted over wired or wireless connections) and computer-readable storage media. Examples of computer-readable storage media include, but are not limited to, a register, cache memory, semiconductor memory devices, magnetic media such as internal hard disks and removable disks, magneto-optical media, optical media such as compact disks (CD) and digital versatile disks (DVDs), a random access memory (RAM), a read-only memory (ROM), an erasable programmable read-only memory (EPROM or Flash memory), a static random access memory (SRAM), and a memory stick. A processor in association with software may be used to implement a radio frequency transceiver for use in a terminal, base station, or any host computer.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The descriptions of the various embodiments herein have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A device comprising:
    at least two electrically distinct layers being mechanically stacked, wherein the at least two electrically distinct layers are configured to be moved, replaced, or exchanged from the device, the at least two electrically distinct layers are not electrically connected, and operate independently within the device, and the at least two electrically distinct layers comprising:
        a bottom layer comprising silicon and comprising a transparent top surface, and
        one or more upper layers,
    wherein each of the one or more upper layers comprises at least one transmissive solar cell comprising a cadmium alloy, is configured to convert light energy into first electricity, and is configured to transmit unconverted portions of the light energy towards the bottom layer, and
    wherein the bottom layer comprises at least one solar cell configured to convert at least part of the unconverted portions of the light energy into second electricity.

2. The device of claim 1, wherein the device comprises a reflective layer below the bottom layer.

3. A modular apparatus comprising:
    at least two electrically distinct modules being mechanically stacked, wherein the at least two electrically distinct modules are configured to be moved, replaced, or exchanged from the modular apparatus, the at least two electrically distinct modules are not electrically connected, and each of the at least two electrically distinct modules generates electricity independent of another of the at least two electrically distinct modules of the modular apparatus, and the at least two electrically distinct modules comprising:
        a silicon module comprising silicon, a transparent top surface, and a plurality of solar cells, and
        a transmissive module comprising a plurality of transmissive solar cells, wherein each transmissive solar cell of the plurality of transmissive solar cells comprises a cadmium alloy,
    wherein the transmissive module is configured to convert light energy received on a first side into first electricity, is adjacent to the transparent top surface, and is configured to transmit unconverted portions of the light energy to the silicon module, and
    wherein the silicon module is configured to convert at least part of the unconverted portions of the light energy into second electricity.

4. The modular apparatus of claim 3, wherein the mechanical stacking of the at least two electrically distinct modules vertically aligns each of the plurality of solar cells with each of the plurality of transmissive solar cells.

5. A system, comprising:
    a plurality of modular apparatuses,
    wherein each modular apparatus comprises at least two electrically distinct modules being mechanically stacked therein,
    wherein the at least two electrically distinct modules are configured to be moved, replaced, or exchanged from the modular apparatus,
    wherein the at least two electrically distinct modules are not electrically connected within the modular apparatus and operate independently, and
    wherein the at least two electrically distinct modules comprise:
        a bottom module, and
        one or more upper transmissive modules,
    wherein each of the one or more upper transmissive modules is configured to convert light energy into first electricity and transmit unconverted portions of the light energy towards the bottom module,
    wherein each bottom module is configured to convert at least part of the unconverted portions of the light energy into second electricity;
    the system further comprising at least two strings,
    wherein each string of the at least two strings corresponds and electrically connects to a layer spanning across the plurality of modular apparatuses and is electrically distinct from each remaining string of the at least two strings.

6. The modular apparatus of claim 3, wherein the mechanical stacking to vertically align the plurality of solar cells with the plurality of transmissive solar cells reduces a negative effect on a power conversion efficiency of the silicon module caused by mechanically stacking the transmissive module.

7. The system of claim 5, wherein the mechanical stacking of the at least two electrically distinct modules vertically aligns a plurality of solar cells of the bottom module with a plurality of transmissive solar cells of the transmissive module.

8. The system of claim 7, wherein the mechanical stacking to vertically align the plurality of solar cells with the plurality of transmissive solar cells reduces a negative effect on a power conversion efficiency of the bottom module caused by mechanically stacking the one or more upper transmissive modules.

\* \* \* \* \*

UNITED STATES PATENT AND TRADEMARK OFFICE
CERTIFICATE OF CORRECTION

PATENT NO. : 12,057,803 B2
APPLICATION NO. : 17/841218
DATED : August 6, 2024
INVENTOR(S) : Conti et al.

Page 1 of 1

It is certified that error appears in the above-identified patent and that said Letters Patent is hereby corrected as shown below:

On the Title Page

On Page 3, Item (56), under "OTHER PUBLICATIONS", in Column 1, Line 15, delete "colulmn," and insert -- column, --, therefor.

In the Specification

In Column 4, Line 63, delete "of the of the" and insert -- of the --, therefor.

In Column 5, Line 12, delete "the" and insert -- in the --, therefor.

In Column 5, Line 33, delete "that are" and insert -- that --, therefor.

In Column 5, Line 37, delete "side of" and insert -- side --, therefor.

In Column 8, Line 44, delete "allow to" and insert -- allow --, therefor.

In Column 8, Line 46, delete "fiber glass," and insert -- fiberglass, --, therefor.

In Column 10, Line 27, delete "fames" and insert -- frames --, therefor.

In Column 10, Line 45, delete "the grid" and insert -- to the grid --, therefor.

In Column 12, Line 19, delete "like to," and insert -- like, --, therefor.

In Column 13, Line 48, delete "(FDMA)" and insert -- (FDMA), --, therefor.

In Column 17, Line 17, delete "wire" and insert -- wire. --, therefor.

Signed and Sealed this
Eighth Day of October, 2024

Katherine Kelly Vidal
*Director of the United States Patent and Trademark Office*